US012660350B2

(12) United States Patent
Chang et al.

(10) Patent No.: US 12,660,350 B2
(45) Date of Patent: Jun. 16, 2026

(54) IMAGE SENSOR STRUCTURE AND METHOD FOR FORMING THE SAME

(71) Applicant: TAIWAN SEMICONDUCTOR MANUFACTURING COMPANY LTD., Hsinchu (TW)

(72) Inventors: Po Chun Chang, New Taipei City (TW); Ping-Hao Lin, Tainan City (TW); Wei-Lin Chen, Tainan City (TW); Kun-Hui Lin, Tainan City (TW); Kuo-Cheng Lee, Tainan City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 487 days.

(21) Appl. No.: 18/150,798

(22) Filed: Jan. 6, 2023

(65) Prior Publication Data

US 2024/0096917 A1 Mar. 21, 2024

Related U.S. Application Data

(60) Provisional application No. 63/375,699, filed on Sep. 15, 2022.

(51) Int. Cl.
*H10F 39/00* (2025.01)

(52) U.S. Cl.
CPC ....... *H10F 39/8067* (2025.01); *H10F 39/024* (2025.01); *H10F 39/807* (2025.01); *H10F 39/811* (2025.01)

(58) Field of Classification Search
CPC .. H10F 39/8067; H10F 39/807; H10F 39/024; H10F 39/811
See application file for complete search history.

(56) References Cited

U.S. PATENT DOCUMENTS

| | | | | |
|---|---|---|---|---|
| 2018/0151759 A1* | 5/2018 | Huang | | H10F 77/40 |
| 2018/0233528 A1* | 8/2018 | Na | | H10F 30/22 |
| 2019/0067355 A1* | 2/2019 | Li | | H10F 39/8067 |
| 2021/0193706 A1* | 6/2021 | Kim | | H10F 39/8053 |
| 2023/0082312 A1* | 3/2023 | Chen | | H10F 39/024 |
| | | | | 257/432 |
| 2023/0170369 A1* | 6/2023 | Kim | | H10F 39/011 |
| | | | | 257/432 |

* cited by examiner

*Primary Examiner* — Christine A Enad
(74) *Attorney, Agent, or Firm* — WPAT LAW; Anthony King

(57) ABSTRACT

An image sensor structure includes a semiconductor substrate, a plurality of image sensing elements, a reflective element, and a high-k dielectric structure. The image sensing elements are in the semiconductor substrate. The reflective element is in the semiconductor substrate and between the image sensing elements. The high-k dielectric structure is between the reflective element and the image sensing elements.

20 Claims, 20 Drawing Sheets

IMAGE SENSOR STRUCTURE AND METHOD FOR FORMING THE SAME

PRIORITY CLAIM AND CROSS-REFERENCE

This application claims the benefit of prior-filed provisional application No. 63/375,699, filed on 15 Sep. 2022.

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component that can be created using a fabrication process) has decreased. Such advances have increased the complexity of processing and manufacturing ICs. For these advances, similar developments in IC processing and manufacturing are needed.

Along with the advantages realized from reducing geometry size, improvements are being made directly to the IC devices. One such IC device is an image sensor device. An image sensor device includes a pixel array (or grid) for detecting light and recording intensity (brightness) of the detected light. The pixel array responds to the light by accumulating a charge. The higher the intensity of the light is, the more the charge is accumulated in the pixel array. The accumulated charge is then used (for example, by other circuitry) to provide image information for use in a suitable application, such as a digital camera.

However, since the feature sizes continue to decrease, fabrication processes continue to become more difficult to perform. Therefore, it is a challenge to form reliable image sensor devices with smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
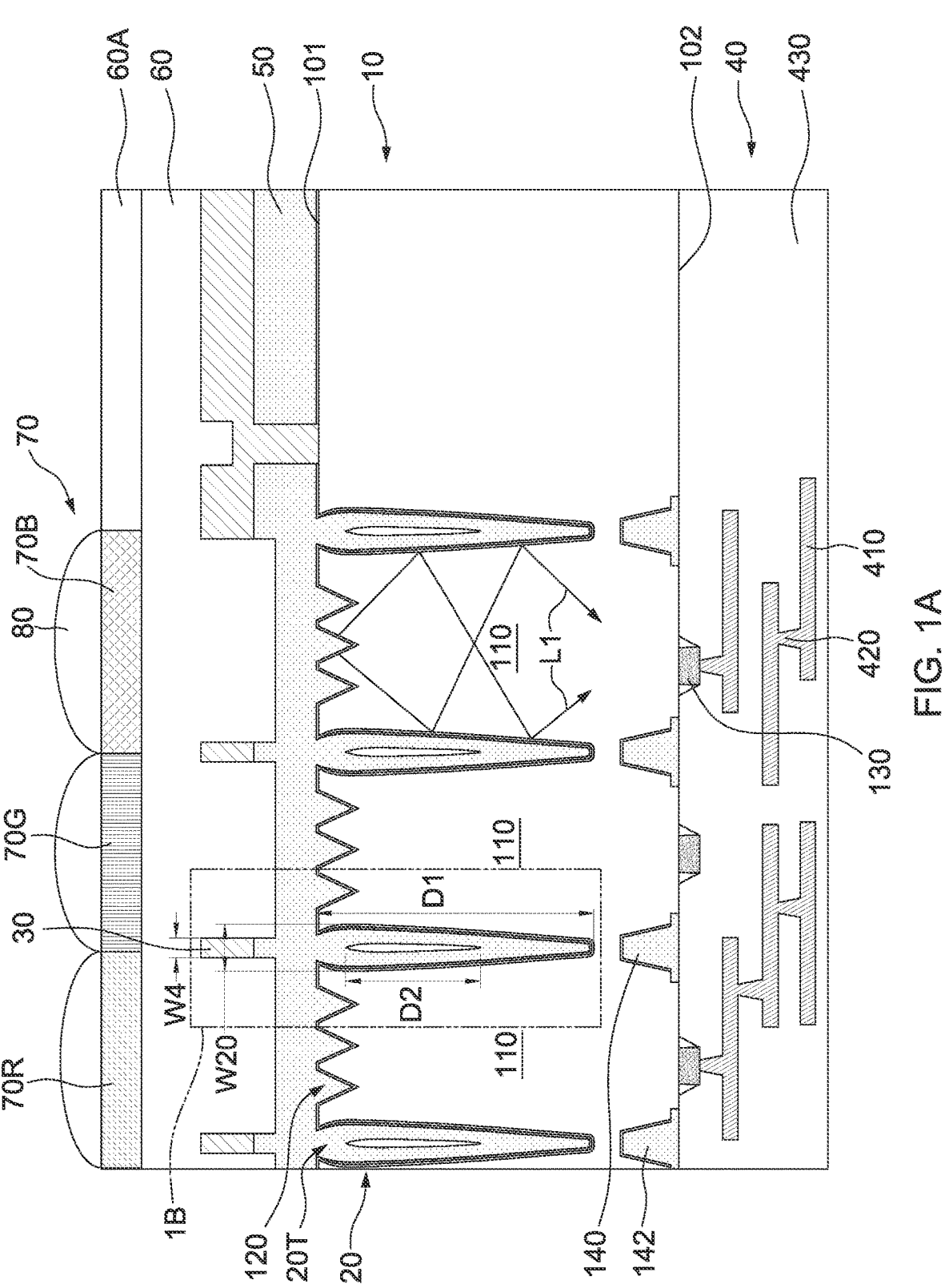
FIG. 1A is a cross-sectional view illustrating an image sensor structure according to aspects of the present disclosure in one or more embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Embodiments of the present disclosure discuss an image sensor structure including a deep trench reflective isolation structure. With the design of the deep trench reflective isolation structure, the reflective element of the deep trench reflective isolation structure can increase the quantum efficiency of the pixels by increasing the optical path of the incident light, and the reflective element can further reflect or block the incident light from entering a neighboring pixel, thus the crosstalk problems between pixels can be reduced or prevented.

Figure 1B:
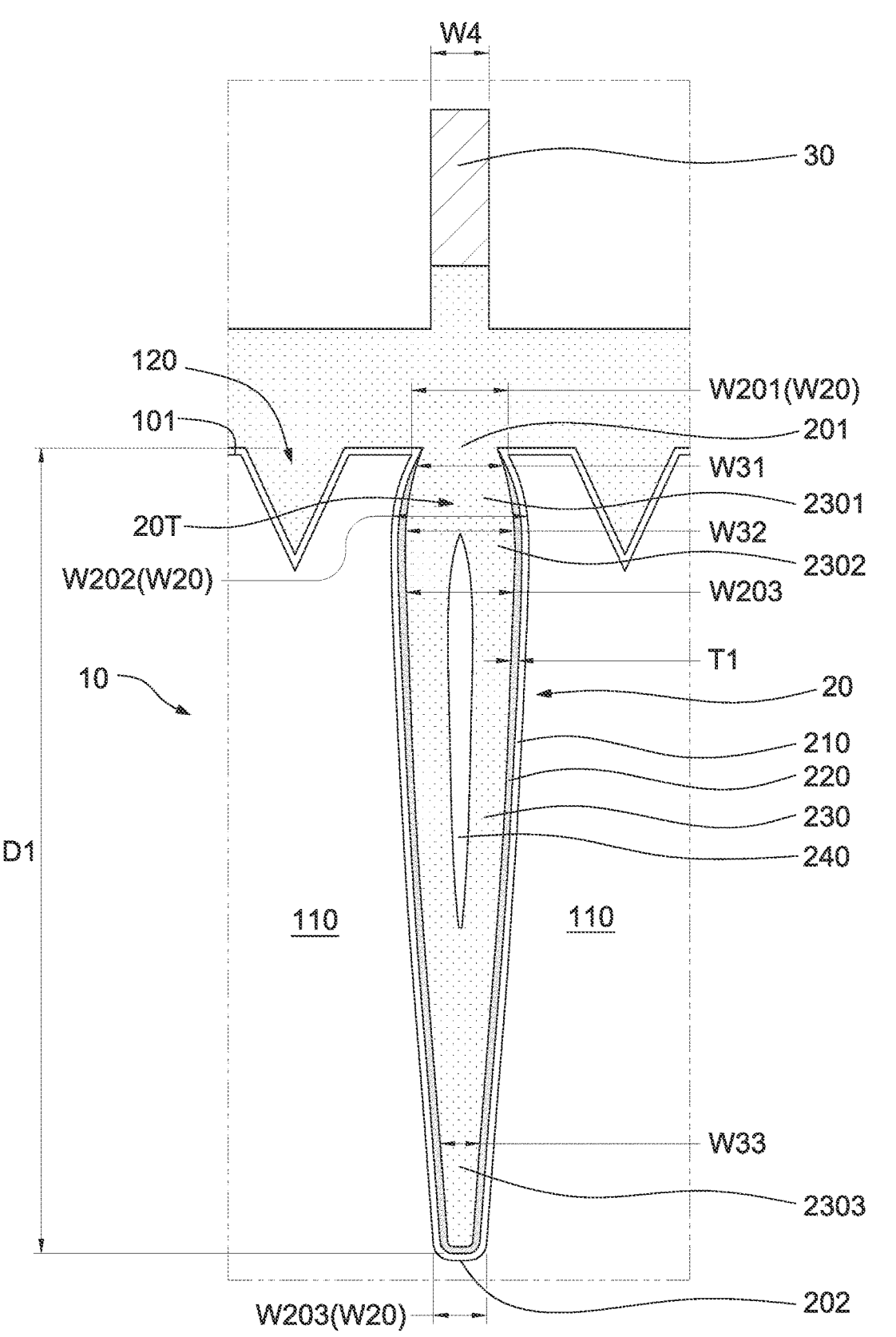
FIG. 1B is a cross-sectional view illustrating a portion of an image sensor structure according to aspects of the present disclosure in one or more embodiments.

FIG. 1A is a cross-sectional view illustrating an image sensor structure 1 according to aspects of the present disclosure in one or more embodiments, and FIG. 1B is a cross-sectional view illustrating a portion of an image sensor structure 1 according to aspects of the present disclosure in one or more embodiments. In some embodiments, FIG. 1B is a cross-sectional view illustrating a portion 1B in FIG. 1A.

Figure 1C:
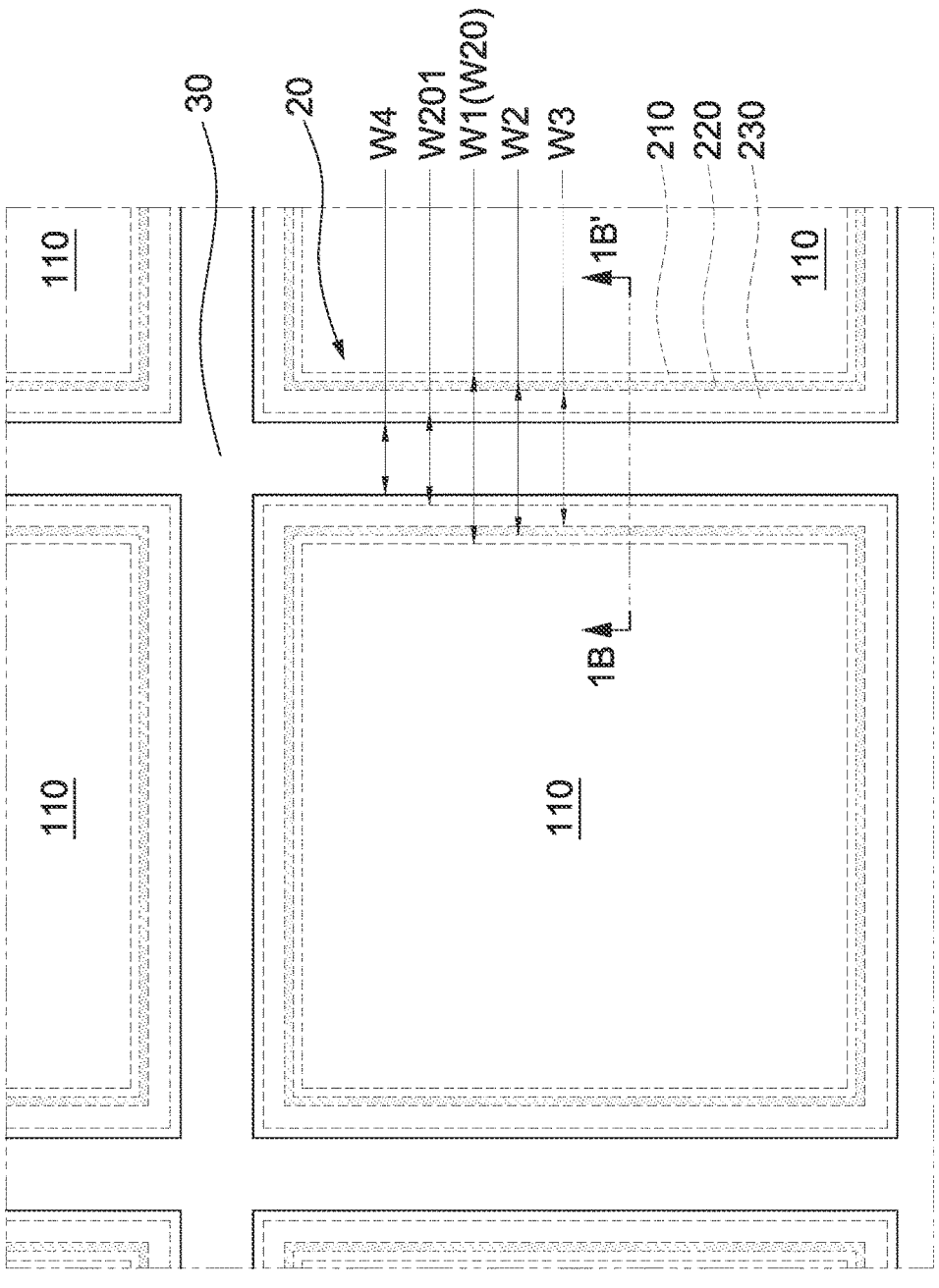
FIG. 1C is a top view illustrating a portion of an image sensor structure according to aspects of the present disclosure in one or more embodiments.

Referring to FIGS. 1A-1C, the image sensor structure 1 includes a semiconductor substrate 10, image sensing elements 110, transistor gate structures 130, isolation structures 140, a deep trench reflective isolation structure 20, a grid structure 30, an interconnection structure 40, a buffer layer 50, dielectric layers 60 and 60A, a light filter structure 70, and lenses 80.

The semiconductor substrate 10 may have a surface 101 (also referred to as "a back surface") and a surface 102 (also referred to as "a front surface") opposite to the surface 101. The semiconductor substrate 10 may be a p-type substrate. For example, the semiconductor substrate 10 may be or include a silicon substrate doped with a p-type dopant such as boron. Alternatively, the semiconductor substrate 10 may be an n-type substrate. For example, the semiconductor substrate 10 may be or include a silicon substrate doped with an n-type dopant such as phosphorous or arsenic. The semiconductor substrate 10 may include other elementary semiconductor materials such as germanium.

The image sensing elements 110 may be in the semiconductor substrate 10. In some embodiments, pixel regions may include pixels each with an image sensing element 110. In some embodiments, the image sensing elements 110 may be or include photodetectors, such as photodiodes. In some embodiments, the image sensing elements 110 may be or include doped regions doped with dopants having a doping polarity opposite from that of the semiconductor substrate 10. The image sensing elements 110 may be formed by one or more implantation processes or diffusion processes. The image sensing elements 110 are operable to sense incident light (or incident radiation) that enters the pixel region. The incident light may be visible light. In some embodiments, the incident light may be infrared (IR), ultraviolet (UV), X-ray, microwave, other suitable types of light, or a combination thereof.

The transistor gate structures 130 may be formed over the surface 102 (or the front surface) of the semiconductor substrate 10 within the pixel regions. In some embodiments, the transistor gate structures 130 may include a transfer transistor, a source-follower transistor, a row select transistor, and/or a reset transistor of a BSI-CIS integrated chip. In some embodiments, the transistor gate structures 130 are electrically connected with the image sensing elements 110 to collect (or pick up) electrons generated by incident light (or incident radiation) traveling into the image sensing elements 110 and to convert the electrons into voltage signals.

The isolation structures 140 may be formed in the semiconductor substrate 10 to define various light-sensing regions (e.g., the image sensing elements 110) in the semiconductor substrate 10. In some embodiments, the isolation structures 140 extend from the surface 102 of the semiconductor substrate 10. In some embodiments, the isolation structures 140 electrically isolate neighboring devices (e.g. transistor gate structures 130) from one another. In some embodiments, the isolation features 140 are formed adjacent to or near the surface 102 of the semiconductor substrate 10. In some embodiments, the isolation structures 140 are made of or include one or more dielectric materials, such as silicon oxide, silicon nitride, silicon oxynitride, fluoride-doped silicate glass (FSG), a low-K dielectric material, other suitable materials, or combinations thereof. In some embodiments, the isolation structures 140 are formed by using an isolation technology, such as local oxidation of semiconductor (LOCOS), shallow trench isolation (STI), or the like.

In some embodiments, the semiconductor substrate 10 has a plurality of grooves 120 extending from the surface 101 (or the back surface) toward the image sensing elements 110. In some embodiments, the grooves 120 form a periodic groove pattern on the surface 101 of the semiconductor substrate 10 and located at the pixel regions. In some embodiments, a depth of the grooves 120 ranges from about 50 nm to about 1000 nm, about 100 nm to about 800 nm, or about 200 nm to about 500 nm. The grooves 120 may alter the surface topography of pixel regions of the semiconductor substrate 10, such that additional surface area of the pixel regions may be exposed, as compared to a planar surface of the semiconductor substrate 10. In some embodiments, the grooves 120 are configured to provide an increase in exposed areas per horizontal unit area that can be achieved without adjusting the areas of the pixel regions. Increasing the exposed surface area increases the effective light incident area and in turn increases the incident light intensity received by the pixel regions (e.g., the image sensing elements 110). As a result, the quantum efficiency of the pixels is improved.

The deep trench reflective isolation structure 20 may be between the image sensing elements 110 and configured to reflect an incident light received by the image sensor structure 1. In some embodiments, the deep trench reflective isolation structure 20 has a surface 201 (also referred to as "a top surface") and a surface 202 (also referred to as "a bottom surface") opposite to the surface 201. In some embodiments, a cross-sectional width (e.g., width W20) of the deep trench reflective isolation structure 20 decreases from a middle portion towards the surface 201 and the surface 202. In some embodiments, the deep trench reflective isolation structure 20 has a depth D1 (or a thickness) and is embedded in the semiconductor substrate 10 to improve device isolation and reduce crosstalk. In some embodiments, the depth D1 (or the thickness) of the deep trench reflective isolation structure 20 is more than about 50%, about 60%, about 70%, or about 80% the thickness of the semiconductor substrate 10. In some embodiments, the depth D1 (or the thickness) of the deep trench reflective isolation structure 20 ranges from about 1500 nm to about 8000 nm, about 1200 nm to about 7000 nm, or about 1000 nm to about 6000 nm. In some embodiments, an aspect ratio of the deep trench reflective isolation structure 20 ranges from about 10 to about 40.

In some embodiments, the surface 201 (or the top surface) of the deep trench reflective isolation structure 20 has a width W201. In some embodiments, the width W201 ranges from about 50 nm to about 500 nm. In some embodiments, the deep trench reflective isolation structure 20 includes a top portion having the width W201, a bottom portion (e.g., a bottom surface 202) having a width W203, and a middle portion having a width W202. In some embodiments, the width W202 is greater than the width W201 and the width W203. In some embodiments, a distance between the surface 201 and the middle portion having the width W202 is about 20% to about 40% or about 30% the depth D1 (or the thickness) of the deep trench reflective isolation structure 20.

In some embodiments, the semiconductor substrate 10 has one or more deep trenches 20T in which the deep trench reflective isolation structure 20 is disposed. In some embodiments, the deep trench reflective isolation structure 20 includes a dielectric liner 210, one or more reflective elements 220, and one or more filling dielectrics 230.

In some embodiments, the dielectric liner 210 is between the image sensing elements 110. The dielectric liner 210 may include silicon oxides or other suitable insulating materials. In some embodiments, the dielectric liner 210 may be or include a high-k dielectric structure. In some embodiments, the dielectric liner 210 includes hafnium oxide ($HfO_2$), tantalum pentoxide ($Ta_2O_5$), zirconium dioxide ($ZrO_2$), aluminum oxide ($Al_2O_3$), other high-k material, and/or combinations thereof. In some embodiments, a thickness of the dielectric liner 210 ranges from about 5 nm to about 50 nm. In some embodiments, the dielectric liner 210 is configured to passivate the surface 101 of the semiconductor substrate 10 and inner surfaces (or inner walls) of the deep trenches 20T of the semiconductor substrate 10. In some embodiments, the dielectric liner 210 is configured to electrically isolate the image sensing elements 110 from one another to reduce electrical crosstalk between the image sensing elements 110.

In some embodiments, the reflective elements 220 are in the semiconductor substrate 10 and between the image sensing elements 110. In some embodiments, the reflective element 220 extends from the surface 101 to the surface 102. In some embodiments, the dielectric liner 210 (or the high-k dielectric structure) is between the reflective element 220 and the semiconductor substrate 10. In some embodiments, the dielectric liner 210 surrounds the reflective element 220. In some embodiments, the dielectric liner 210 covers side surfaces and bottom surfaces of the reflective elements 220. In some embodiments, the dielectric liner 210 (or the high-k dielectric structure) is between the reflective element 220 and the image sensing elements 110. In some embodiments, the reflective element 220 is free from overlapping the image sensing elements 110 from a top view perspective. In some embodiments, the reflective element 220 is free from covering light-receiving surfaces of the image sensing elements 110. In some embodiments, the reflective element 220 directly contacts the dielectric liner 210 (or the high-k dielectric structure). In some embodiments, the reflective element 220 has a reflection rate of about 30% or higher with respect to an incident light of the image sensor structure 1. In some embodiments, the reflective element 220 has a reflection rate of about 30%, about 40%, about 50%, about 60%, about 70%, about 80%, about 90%, or about 100% with respect to an incident light of the image sensor structure 1.

In some embodiments, the reflective element 220 has a refractive index lower than that of the semiconductor substrate 10. In some embodiments, the reflective element 220 may be or include a reflective layer. In some embodiments, the reflective element 220 has a thickness T1 decreasing toward the surface 101 of the semiconductor substrate 10. In some embodiments, the thickness T1 of the reflective element 220 is about 5 nm to about 250 nm. In some embodiments, a ratio of the thickness T1 of the reflective element 220 to the width 20 of the deep trench reflective isolation structure 20 ranges from about 5% to about 100%. In some embodiments, the reflective element 220 includes a metal material or an alloy material. In some embodiments, the reflective element 220 includes Al, Au, Ag, Ni, Co, W, Cu, Ti, Pt, TiN, alloys thereof, compounds thereof (e.g., silicide), combinations thereof, or other suitable reflective materials. In some embodiments, the reflective element 220 includes a dummy metal layer, which is electrically isolated from any conductive components (e.g., transistor gate structures 130, the interconnection structure 40, or any conductive component of the image sensor structure 1 or external to the image sensor structure 1). In some embodiments, the reflective element 220 may include one or more dielectric materials, such as silicon oxides, silicon nitrides, or silicon carbides.

In some embodiments, the filling dielectric 230 (also referred to as "a filling dielectric structure") is between the image sensing elements 110. In some embodiments, the reflective element 220 is between the filling dielectric 230 and the dielectric liner 210 (or the high-k dielectric structure). In some embodiments, the filling dielectric 230 is partially or entirely covered by the reflective element 220. In some embodiments, the reflective element 220 surrounds the filling dielectric 230. In some embodiments, the reflective element 220 covers a side surface and a bottom surface of the filling dielectric 230. In some embodiments, the filling dielectric 230 includes a top portion 2301 having a width W31, a bottom portion 2303 having a width W33, and a middle portion 2302 having a width W32 between the top portion 2301 and the bottom portion 2303. In some embodiments, the width W31 of the top portion 2301 and the width W33 of the bottom portion 2303 are less than the width W32 of the middle portion 2302. In some embodiments, the width W31 of the top portion 2301 is greater than the width W33 of the bottom portion 2303. In some embodiments, the width 32 of the middle portion 2302 of the filling dielectric 230 ranges from about 20 nm to about 500 nm. In some embodiments, the filling dielectric 230 includes a light-blocking structure having a light absorptivity ranging from about 60% to about 100% with respect to an incident light of the image sensor structure 1. In some embodiments, the filling dielectric 230 is configured to absorb the incident light arriving at the filling dielectric 230 to prevent the incident light from traveling between different image sensing elements 110. In some embodiments, the filling dielectric 230 includes silicon oxide.

According to some embodiments of the present disclosure, the combination of the reflective element 220 and the filling dielectric 230 not only can reflect the incident light to increase the optical path and thereby increase the quantum efficiency but also can absorb, if any, portions of the incident light that penetrate the reflective element 220 toward a neighboring pixel region, so as to significantly reduce crosstalk.

In some embodiments, a void 240 (or a seam or a gap) may be formed within the filling dielectric 230. In some embodiments, the void 240 may be filled with air or an inner gas. In some embodiments, the void 240 is closer to the surface 101 than to the surface 102 of the semiconductor substrate 10. In some embodiments, the void 240 has a depth D2 (or a thickness) that is about 50% or less of the depth D1 (or the thickness) of the deep trench reflective isolation structure 20. In some embodiments, the depth D2 (or the thickness) of the void 240 may range from about 10% to about 90% the depth D1 (or the thickness) of the deep trench reflective isolation structure 20. In some embodiments, the depth D2 (or the thickness) of the void 240 may range from about 10% to about 90% the maximum depth (or the thickness or the height) of the filling dielectric 230. In some embodiments, the depth D2 (or the thickness) of the void 240 ranges from about greater than 0 nm to about 4000 nm, about 10 nm to about 3000 nm, or about 100 nm to about 2000 nm. In some embodiments, a width of the void 240 may range from about 10% to about 90% the maximum width (e.g., the width 32) of the filling dielectric 230. In some embodiments, a distance between an edge of the void 240 and an edge of the reflective element 220 ranges from about 5 nm to about 150 nm.

In some embodiments, an isolation liner 142 may be disposed or formed between the isolation structure 140 and the semiconductor substrate 10. In some embodiments, the isolation liner 142 may include a single layer or a multilayer structure. In some embodiments, the isolation liner 142 may be made of or include a dielectric material similar to or the same as that of the dielectric liner 210. In some embodiments, the isolation liner 142 may further include a reflective material similar to or the same as that of the reflective element 220. In some embodiments, the isolation liner 142 may include a high-k dielectric structure and a reflective material having a reflection rate of about 30%, about 40%, about 50%, about 60%, about 70%, about 80%, about 90%, or about 100% with respect to an incident light of the image sensor structure 1.

In some embodiments, the grid structure 30 is over the semiconductor substrate 10. In some embodiments, the thickness T1 of the reflective element 220 decreases toward the grid structure 30. In some embodiments, the grid structure 30 is over the deep trench reflective isolation structure 20. In some embodiments, the grid structure 30 is aligned with the deep trench reflective isolation structure 20. In some embodiments, a width W4 of the grid structure 30 is less than the width W20 of the deep trench reflective isolation structure 20. In some embodiments, the width W4 of the grid structure 30 is less than the width W201 of the surface 201 of the deep trench reflective isolation structure 20. In some embodiments, the width W4 is about 140 nm to about 150 nm. The grid structure 30 may be used to prevent the incident light from entering a neighboring pixel, and thus the crosstalk problems between pixels can be reduced or prevented. In some embodiments, the grid structure 30 is made of or includes a metal material, such as a reflective metal. In some embodiments, the grid structure 30 is made of or includes aluminum, silver, copper, titanium, platinum, tungsten, tantalum, tantalum nitride, other suitable materials, or a combination thereof.

The interconnection structure 40 may be formed over the surface 102 (or the front surface) of the semiconductor substrate 10. In some embodiments, the interconnection structure 40 includes one or more dielectric layers and one or more conductive patterns that couple to various elements, such as doped regions, photodiodes, circuitry, and/or transistor gate structures. In some embodiments, the interconnection structure 40 includes conductive lines 410, conductive vias 420, and an interlayer dielectric (ILD) layer 430. In some embodiments, the transistor gate structures 130 are embedded in the ILD layer 430.

In some embodiments, the buffer layer 50 is formed between the deep trench reflective isolation structure 20 and the grid structure 30. In some embodiments, the buffer layer 50 is directly formed on the dielectric liner 210. In some embodiments, the buffer layer 50 is made of a dielectric material or other suitable materials, for example, silicon oxide, silicon nitride, silicon oxynitride, other applicable materials, or a combination thereof. In some embodiments, the buffer layer 50 and the filling dielectric 230 may be formed of or include the same material.

In some embodiments, the dielectric layer 60 is formed over the grid structure 30. In some embodiments, the dielectric layer 60 may serve as a planarization layer for the light filter structure 70. In some embodiments, a bottom surface of the dielectric layer 60 is conformal with the grid structure 30. In some embodiments, the dielectric layer 60 is transparent to the incident light of the image sensor structure 1. In some embodiments, the dielectric layer 60 may be made of or include silicon oxide, silicon nitride, silicon oxynitride, or other suitable materials.

In some embodiments, the light filter structure 70 is formed or disposed on the planar top surface of the dielectric layer 60. In some embodiments, the light filter structure 70 includes light filters 70R, 70G, and 70B (e.g., color filters). In some embodiments, the light filters 70R, 70G, and 70B may be used to filter through visible light. The light filters 70R, 70G, and 70B may be used to filter through a red wavelength band, a green wavelength band, and a blue wavelength band, respectively.

In some embodiments, the dielectric layer 60A is formed or disposed on the planar top surface of the dielectric layer 60. In some embodiments, the dielectric layer 60A is transparent to the incident light of the image sensor structure 1. In some embodiments, the dielectric layer 60A may be made of or include silicon oxide, silicon nitride, silicon oxynitride, or other suitable materials. The dielectric layer 60A may define a black level correction (BLC) region adjacent to the pixel region.

In some embodiments, the lenses 80 are respectively formed over the light filters 70R, 70G, and 70B. In some embodiments, the lenses 80 are used to direct or focus the incident light. In some embodiments, the lenses 80 may include a microlens array. In some embodiments, the lenses 80 may be made of a high transmittance material. For example, the high transmittance material includes a transparent polymer material (such as polymethylmethacrylate, PMMA), a transparent ceramic material (such as glass), other applicable materials, or a combination thereof.

As illustrated in FIG. 1A, an incident light L1 passing through the light filters and arrived at the image sensing element 110 may be reflected by the deep trench reflective isolation structure 20 (e.g., the reflective element 220) to generate multiple reflections to increase the optical path of the incident light L1 within the image sensing element 110 (or the pixel region). Therefore, the incident light intensity received by the pixel regions (e.g., the image sensing elements 110) can be increased, and thus the quantum efficiency of the pixels is improved.

According to some embodiments of the present disclosure, the dielectric liner 210 can serve to improve the quality of the interface between the semiconductor substrate 10 and the reflective element 220, such that the reflective element 220 can be conformally formed on inner surfaces or inner walls of the trenches 20T, and thus leakage which could have been generated from defects at the interface can be prevented.

In addition, according to some embodiments of the present disclosure, with the design of the deep trench reflective isolation structure 20, the reflective element 220 can increase the quantum efficiency of the pixels by increasing the optical path of the incident light, and the reflective element 220 can further reflect or block the incident light from entering a neighboring pixel, thus the crosstalk problems between pixels can be reduced or prevented.

FIG. 1C is a top view illustrating a portion of an image sensor structure 1 according to aspects of the present disclosure in one or more embodiments. In some embodiments, FIG. 1C is a top view illustrating a portion of the image sensor structure 1 in FIG. 1A, and some components/elements are omitted for clarity. In some embodiments, FIG. 1B is a cross-sectional view along the line 1B-1B' in FIG. 1C.

In some embodiments, the deep trench reflective isolation structure 20 defines a plurality of openings or spaces for isolating the pixel regions (e.g., the image sensing elements 110). In some embodiments, the surface 201 (or the top surface) of the deep trench reflective isolation structure 20 has a width W201, and the width W4 of the grid structure 30 is less than the width W201 of the surface 201 of the deep trench reflective isolation structure 20. In some embodiments, a maximum width W1 of the dielectric liner 210 is greater than a maximum width W2 of the reflective element 220. In some embodiments, the maximum width W2 of the reflective element 220 is greater than a maximum width W3 of the filling dielectric 230. In some embodiments, the maximum width W1 of the dielectric liner 210 equals to a maximum width (e.g., the width W20) of the deep trench reflective isolation structure 20. In some embodiments, the width W4 of the grid structure 30 is less than the width W2 of the reflective element 220.

Figure 2A:
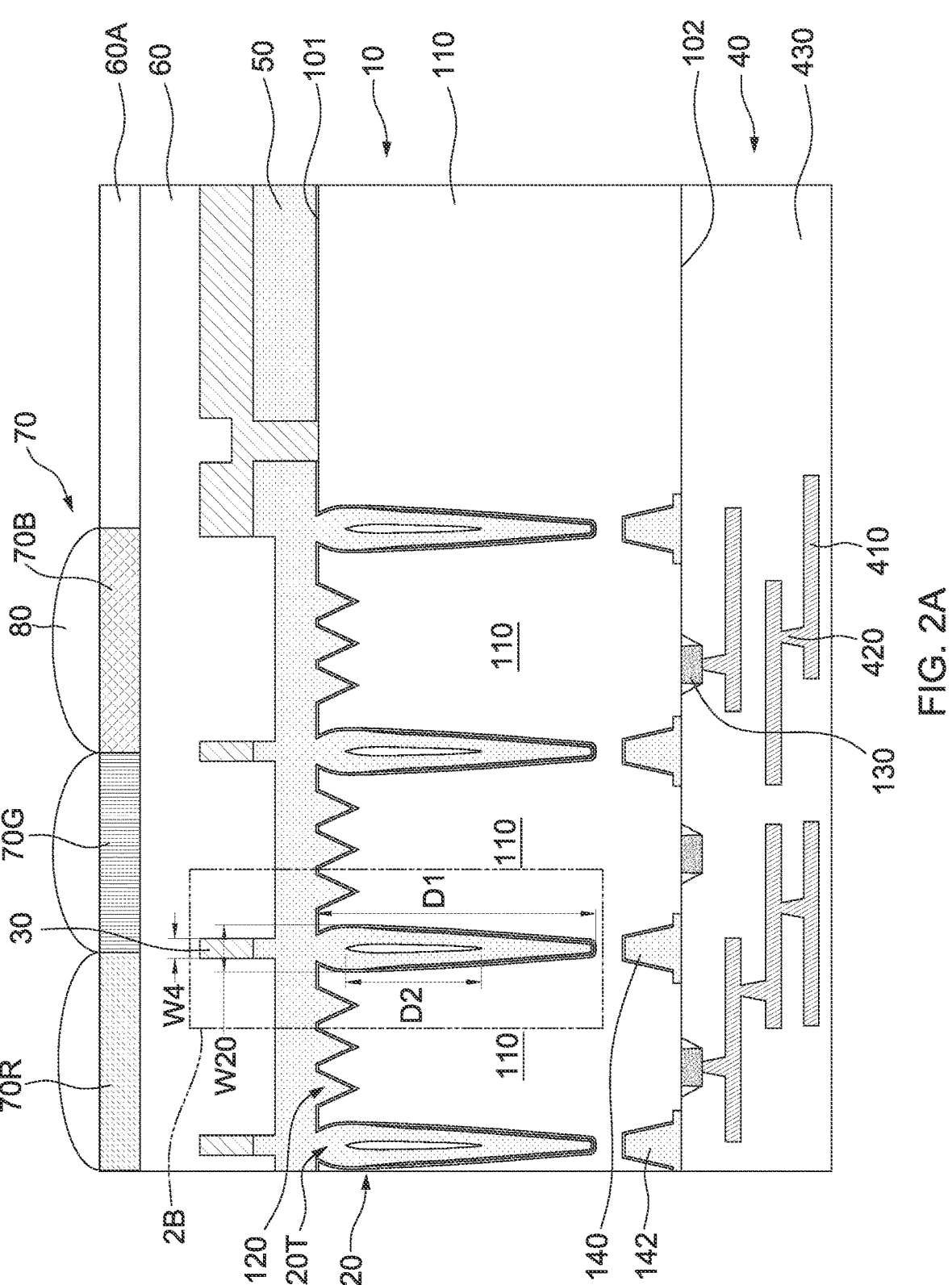
FIG. 2A is a cross-sectional view illustrating an image sensor structure according to aspects of the present disclosure in one or more embodiments.
Figure 2B:
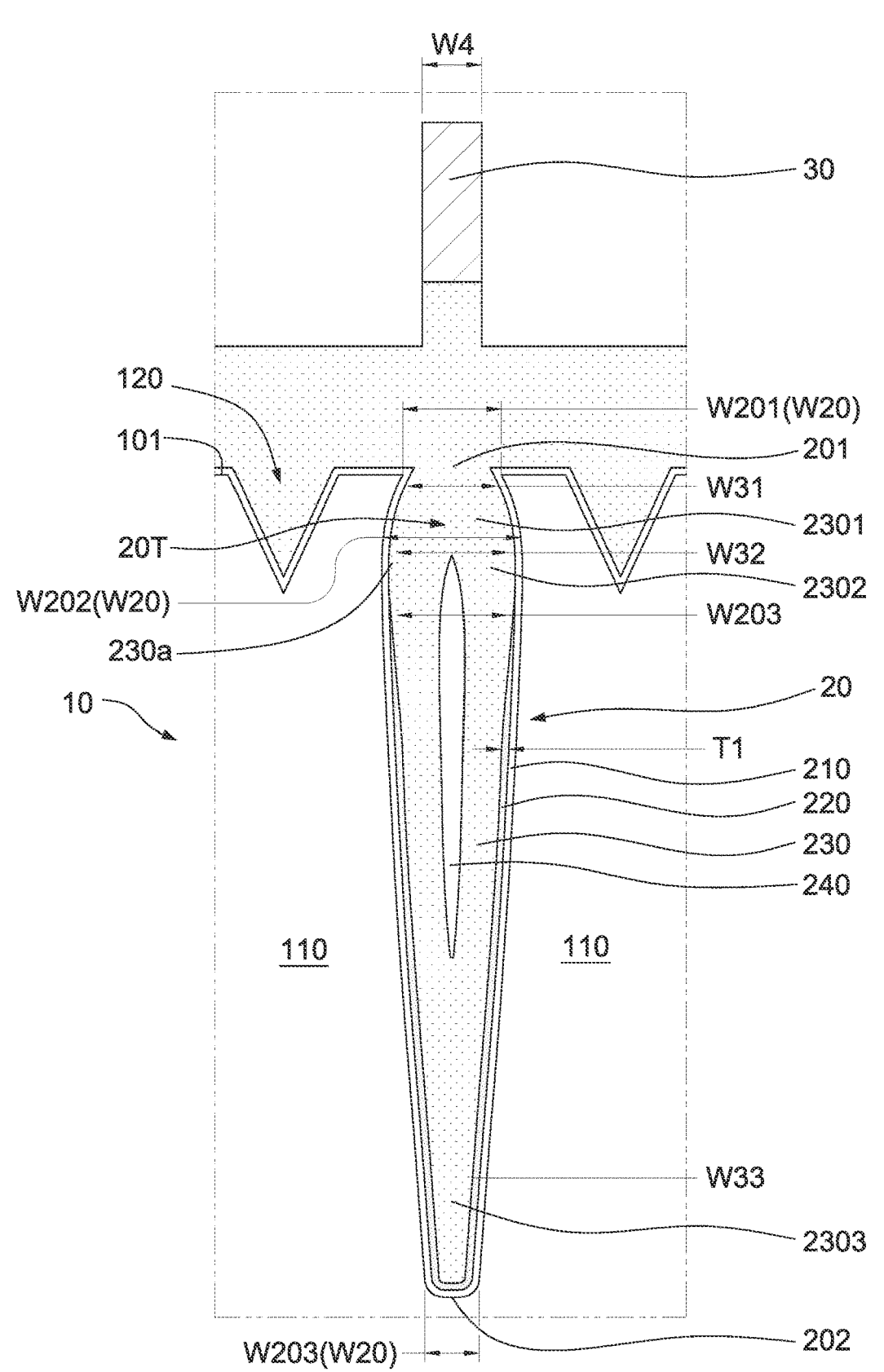
FIG. 2B is a cross-sectional view illustrating a portion of an image sensor structure according to aspects of the present disclosure in one or more embodiments.

FIG. 2A is a cross-sectional view illustrating an image sensor structure 2 according to aspects of the present disclosure in one or more embodiments, and FIG. 2B is a cross-sectional view illustrating a portion of an image sensor structure according to aspects of the present disclosure in one or more embodiments. In some embodiments, FIG. 2B is a cross-sectional view illustrating a portion 2B in FIG. 2A. In some embodiments, the image sensor structure 2 is similar to the image sensor structure 1 in FIGS. 1A-1B, with differences therebetween as follows. Descriptions of similar components are omitted.

In some embodiments, a portion of a lateral surface 230a of the filling dielectric 230 is exposed by the reflective element 220. In some embodiments, a portion of the lateral surface 230a of the filling dielectric 230 contacts the dielectric liner 210 (or the high-k dielectric structure). In some embodiments, the middle portion 2302 of the filling dielectric 230 having the width W32 is exposed by the reflective element 220. In some embodiments, the middle portion 2302 of the filling dielectric 230 having the width W32 contacts the dielectric liner 210. In some embodiments, the portion of the lateral surface 230a exposed by the reflective element 220 is adjacent to the surface 101 of the semiconductor substrate 10. In some embodiments, the portion of the lateral surface 230a exposed by the reflective element 220 is about less than about 40%, about 30%, or about 20% the lateral surface 230a.

Figure 3A:
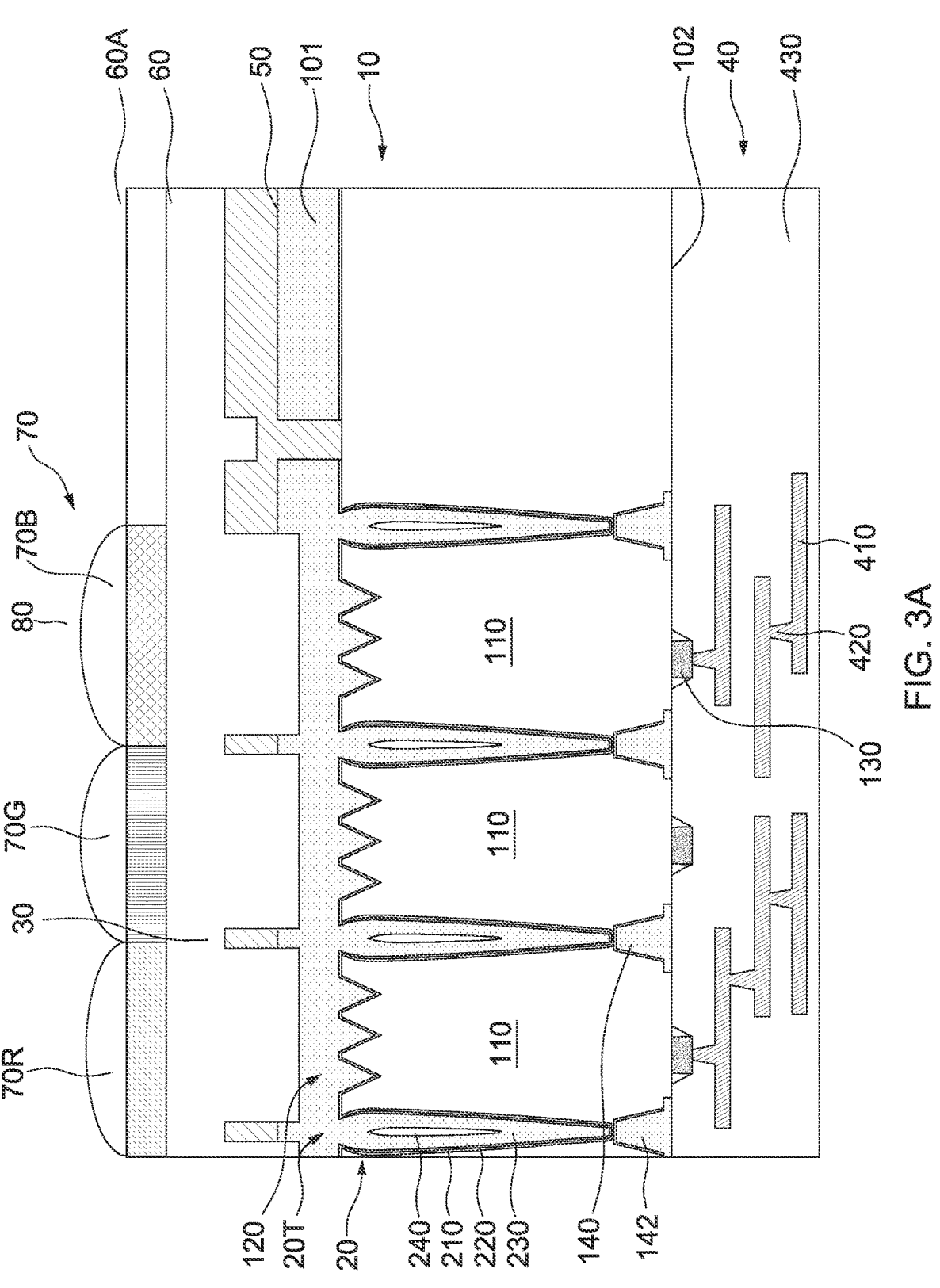
FIG. 3A is a cross-sectional view illustrating an image sensor structure according to aspects of the present disclosure in one or more embodiments.

FIG. 3A is a cross-sectional view illustrating an image sensor structure 3A according to aspects of the present disclosure in one or more embodiments. In some embodiments, the image sensor structure 3A is similar to the image sensor structure 1 in FIGS. 1A-1B, with differences therebetween as follows. Descriptions of similar components are omitted.

In some embodiments, the deep trench reflective isolation structure 20 contacts the isolation structure 140. In some embodiments, the isolation structure 140 extends from the surface 102 of the semiconductor substrate 10 and is connected to the reflective element 220. In some embodiments, the isolation liner 142 extends from the surface 102 of the semiconductor substrate 10 and is connected to the reflective element 220. In some embodiments, the deep trench reflective isolation structure 20 contacts the isolation liner 142 that covers the isolation structure 140. According to some embodiments of the present disclosure, with the design of the deep trench reflective isolation structure 20 combined with the isolation structure 140 (or the isolation liner 142), the image sensing elements 110 can be substantially entirely isolated from one another to further reduce electrical crosstalk between the image sensing elements 110.

Figure 3B:
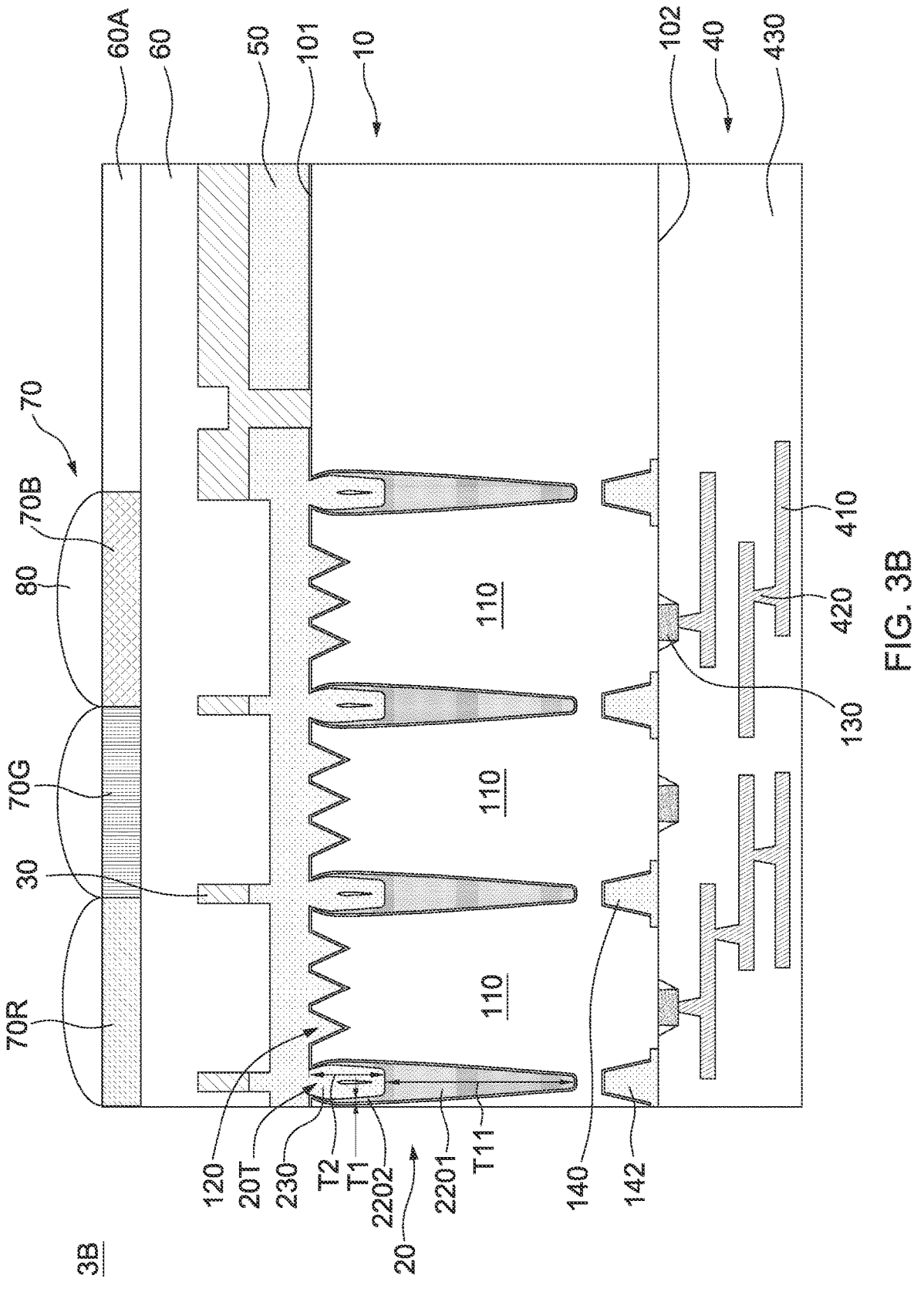
FIG. 3B is a cross-sectional view illustrating an image sensor structure according to aspects of the present disclosure in one or more embodiments.

FIG. 3B is a cross-sectional view illustrating an image sensor structure 3B according to aspects of the present disclosure in one or more embodiments. In some embodiments, the image sensor structure 3B is similar to the image sensor structure 1 in FIGS. 1A-1B, with differences therebetween as follows. Descriptions of similar components are omitted.

In some embodiments, the reflective element 220 includes a portion 2201 directly under the filling dielectric 230 and having a thickness T11 greater than a thickness T2 of the filling dielectric 230. In some embodiments, the reflective element 220 has a portion 2202 between the dielectric liner 210 and a lateral surface of the filling dielectric 230 and having the thickness T1 less than the thickness T11 of the portion 2201.

Figure 3C:
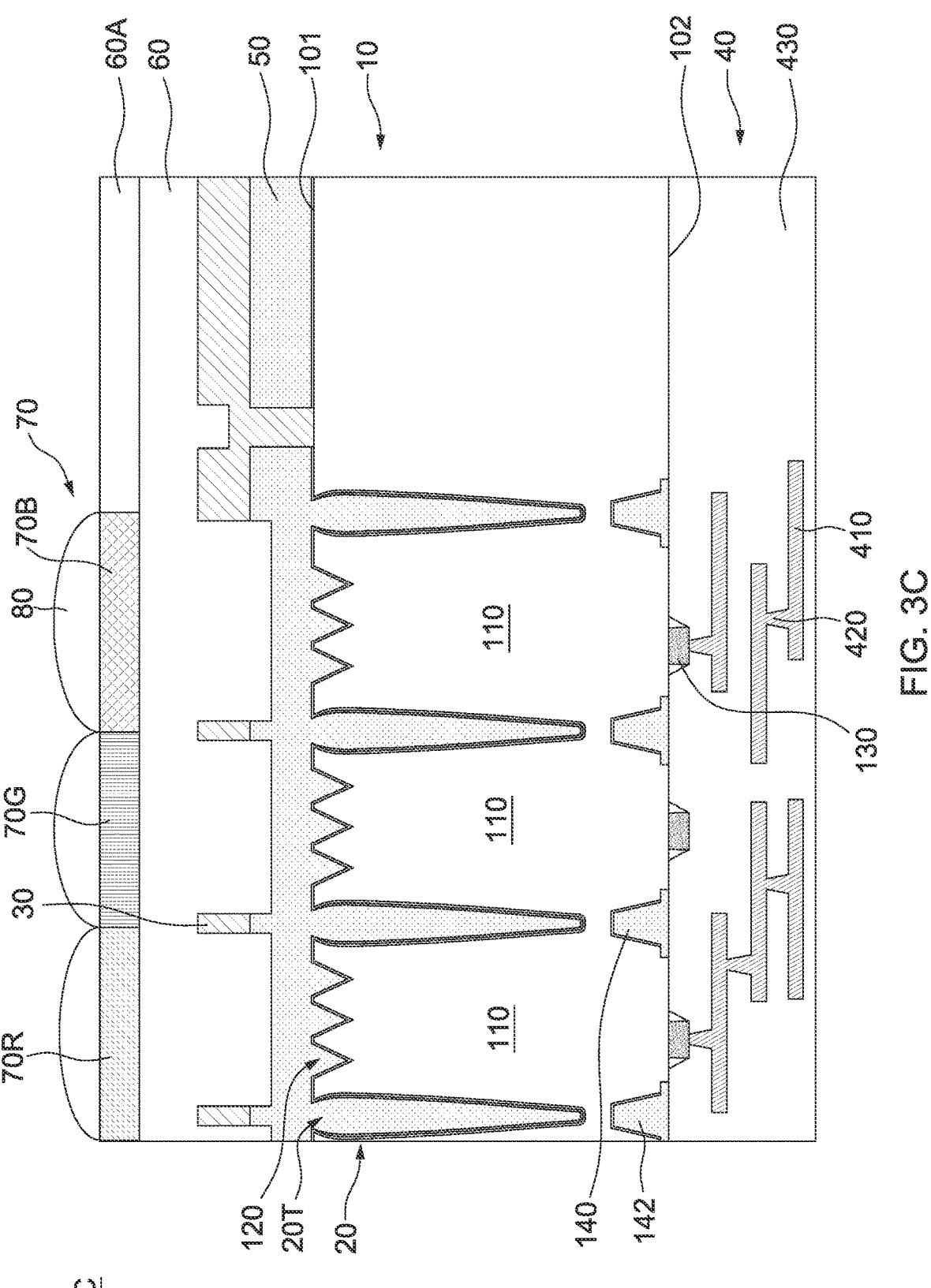
FIG. 3C is a cross-sectional view illustrating an image sensor structure according to aspects of the present disclosure in one or more embodiments.

FIG. 3C is a cross-sectional view illustrating an image sensor structure 3C according to aspects of the present disclosure in one or more embodiments. In some embodiments, the image sensor structure 3C is similar to the image sensor structure 1 in FIGS. 1A-1B, with differences therebetween as follows. Descriptions of similar components are omitted.

In some embodiments, the image sensor structure 3C is substantially free of voids (or seams or gaps) within the filling dielectric 230 of the deep trench reflective isolation structure 20. According to some embodiments of the present disclosure, with the image sensor structure 3C being substantially free of voids (or seams or gaps) within the filling dielectric 230, the isolation between pixels can be further improved.

FIGS. 4A to 4F are cross-sectional views illustrating an image sensor structure 1 at various fabrication stages according to aspects of the present disclosure in one or more embodiments.

Figure 4A:
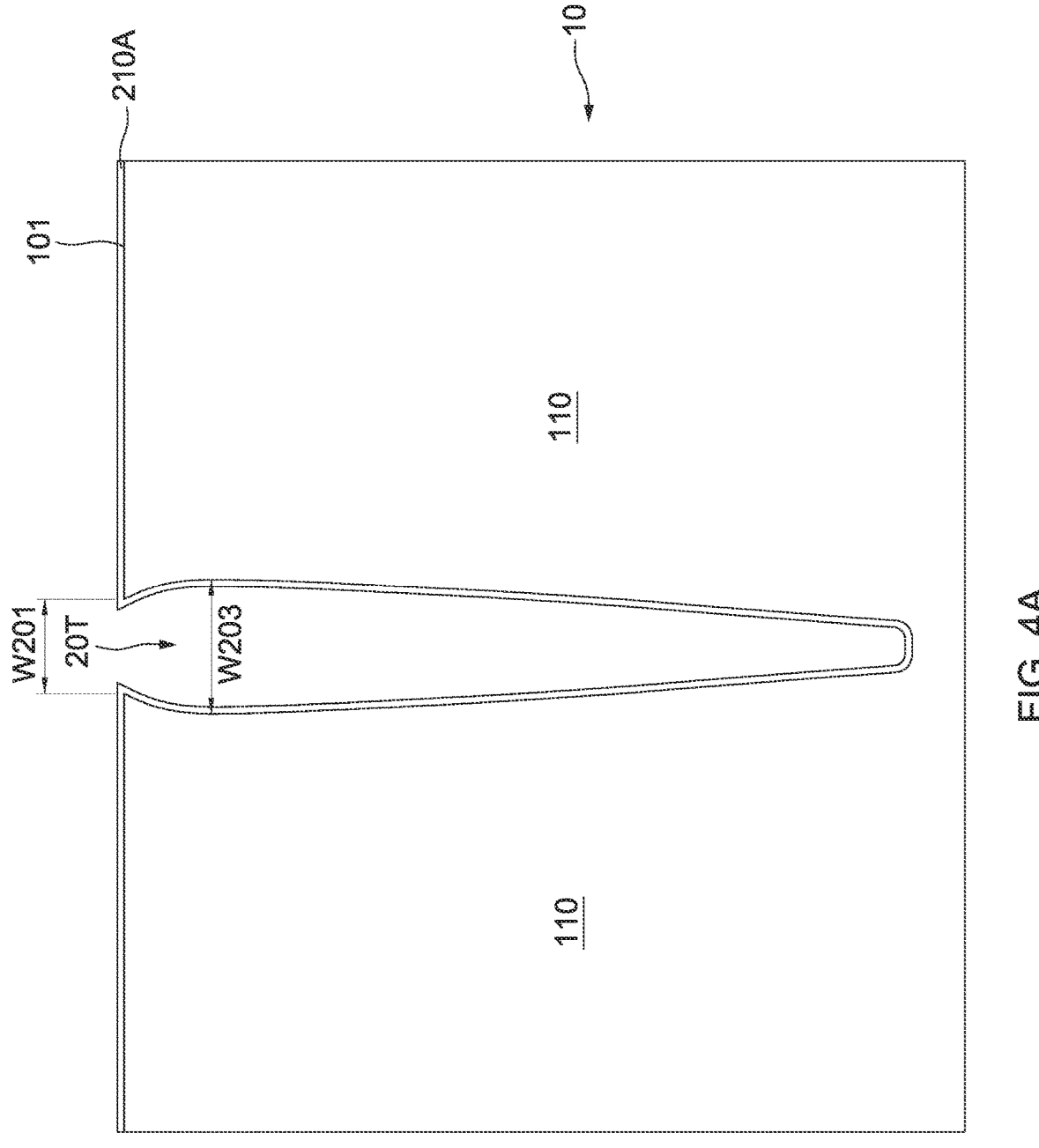
FIGS. 4A to 4F are cross-sectional views illustrating an image sensor structure at various fabrication stages according to aspects of the present disclosure in one or more embodiments.

Referring to FIG. 4A, a plurality of image sensing elements 110 may be formed in a semiconductor substrate 10, a deep trench 20T may be formed in the semiconductor substrate 10 and between the image sensing elements 110, and a dielectric liner 210A may be formed in the deep trench 20T. The dielectric liner 210A may be or include a high-k dielectric material. In some embodiments, the deep trench 20T may be formed by a dry etch process. In some embodiments, the deep trench 20T has an opening having a width W201 less than a width W203 of a middle portion of the deep trench 20T. In some embodiments, the width W203 is about 170 nm to about 190 nm. In some embodiments, the dielectric liner 210A is formed by, for example, a chemical vapor deposition (CVD) process, a thermal oxidation process, or other suitable process.

Figure 4B:
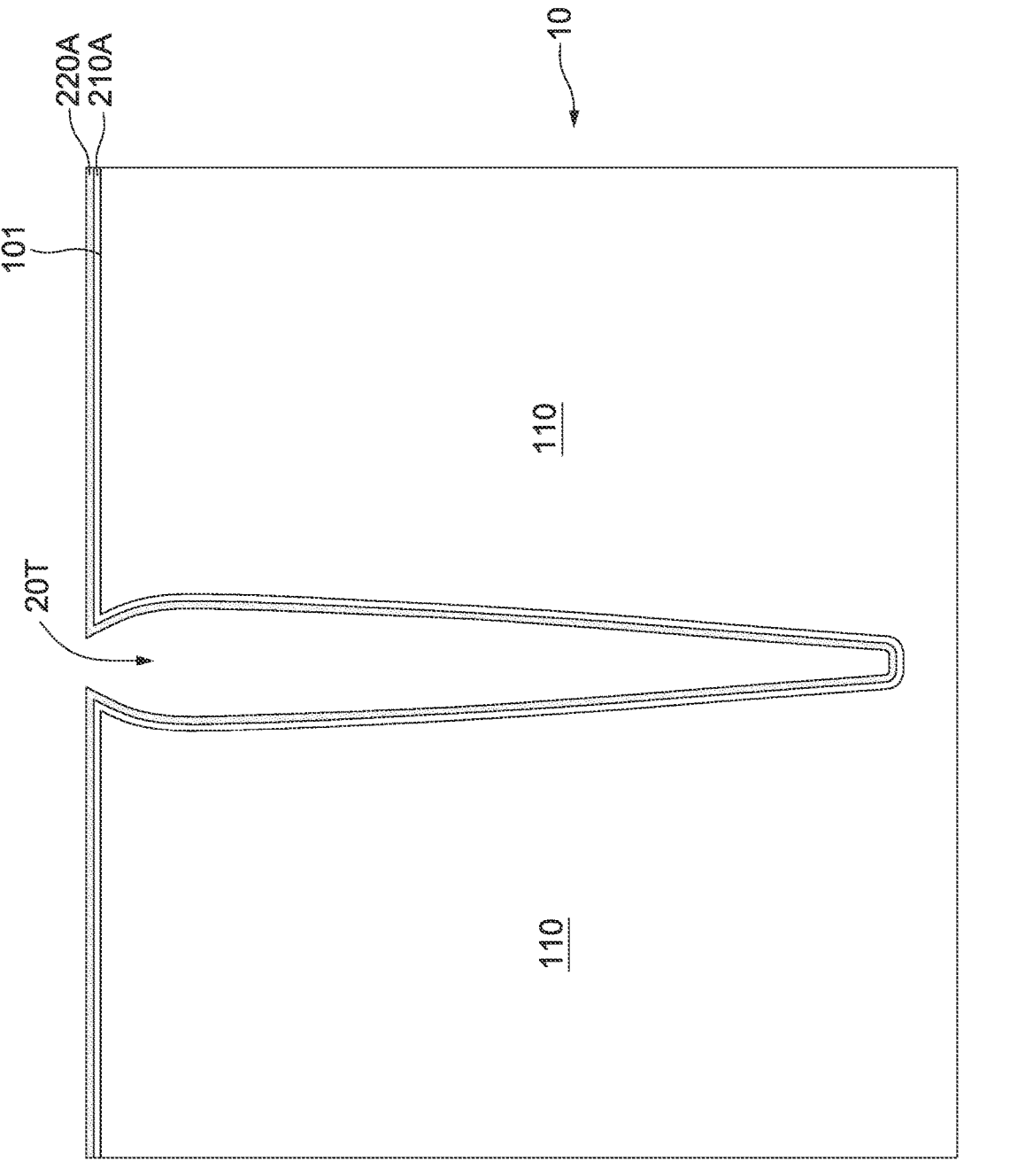

Referring to FIG. 4B, a reflective material 220A may be formed on the dielectric liner 210A and in the trench 20T. In some embodiments, the reflective material 220A is formed by, for example, an atomic layer deposition (ALD) process, a CVD process, or other suitable deposition process.

Figure 4C:
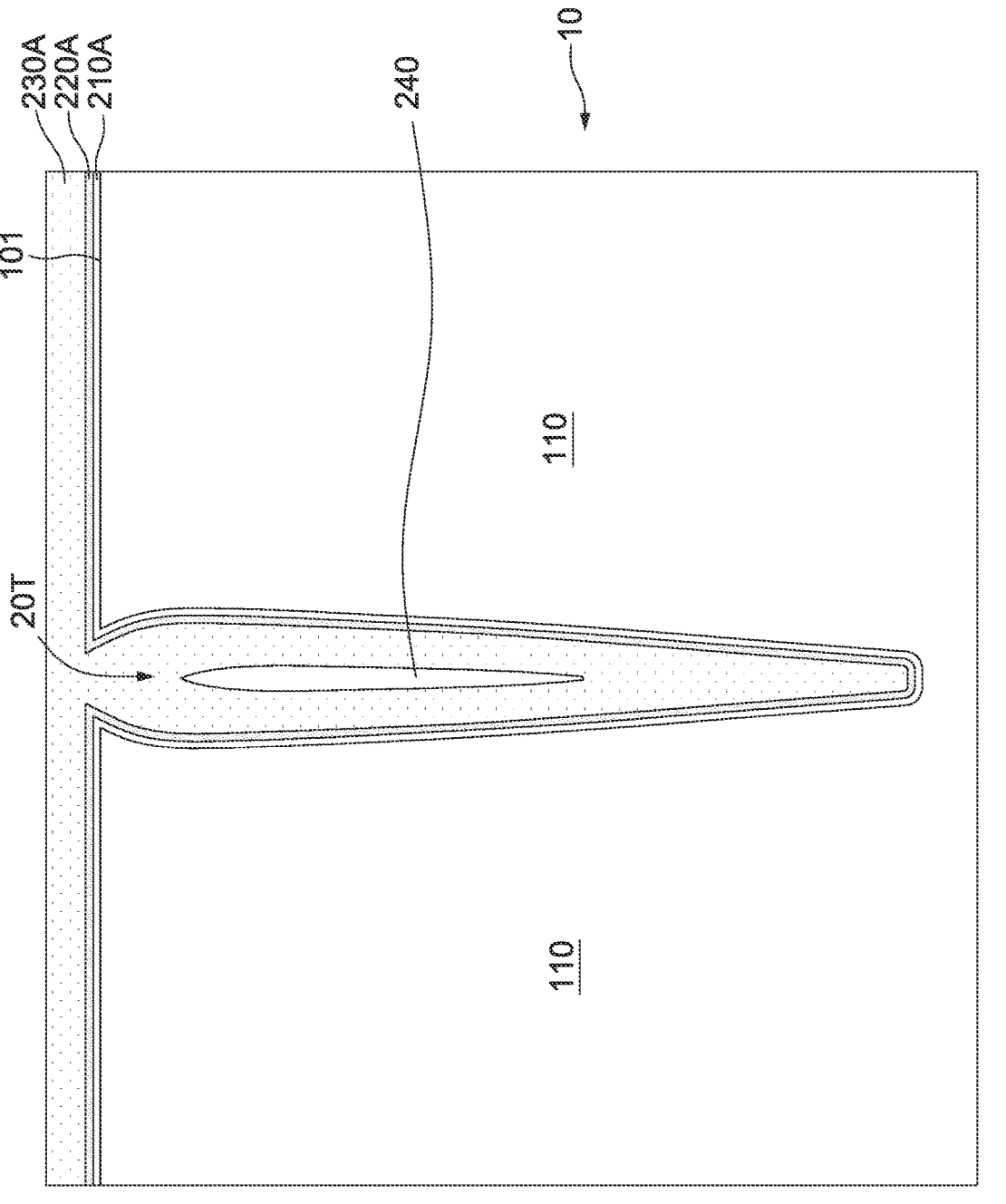

Referring to FIG. 4C, a filling dielectric 230A may be formed on the reflective material 220A and in the deep trench 20T. In some embodiments, a void 240 may be formed within the filling dielectric 230A. In some embodiments, the filling dielectric 230A is formed by, for example, a CVD process or other suitable process.

Figure 4D:
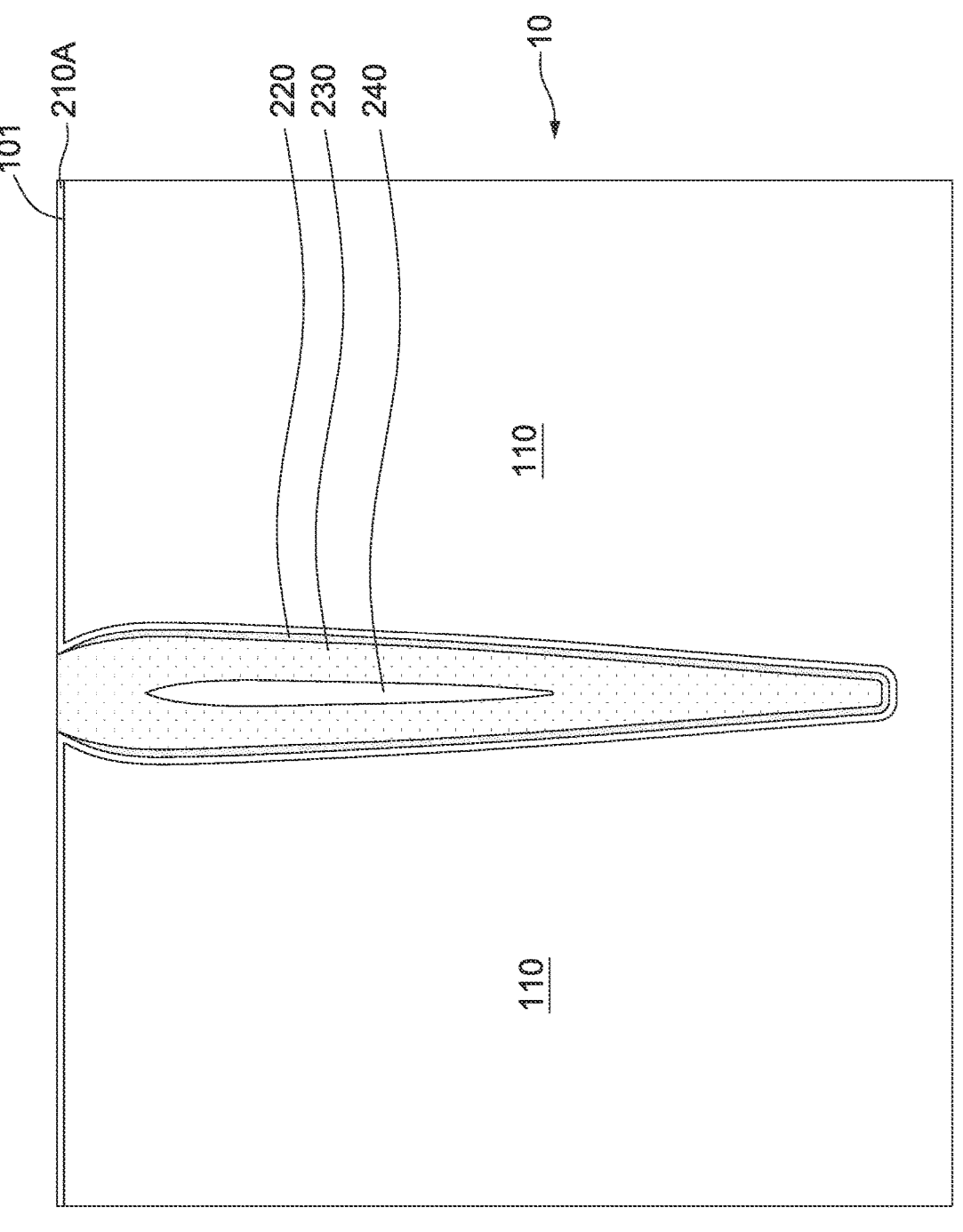

Referring to FIG. 4D, a removal process may be performed to remove a portion of the filling dielectric 230A and a portion of the reflective material 220A to form a reflective element 220 on the dielectric liner 210A in the deep trench 20T and a filling dielectric 230 on the reflective element 220 in the deep trench 20T. In some embodiments, portions of the filling dielectric 230A and the reflective material 220A outside of the trench 20T and over the dielectric liner 210A are removed. In some embodiments, the removal process may be a chemical mechanical polishing (CMP) process.

Figure 4E:
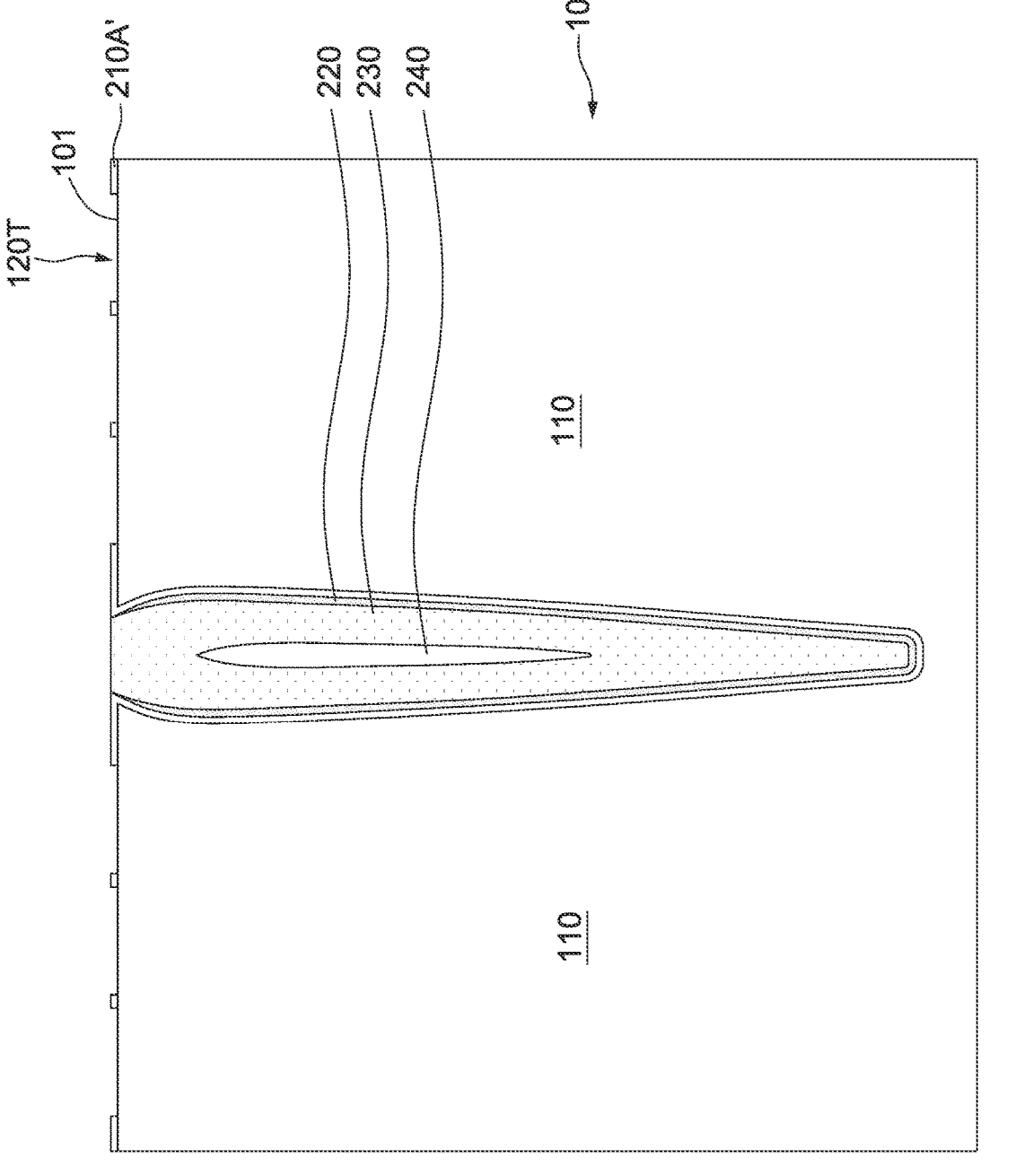

Referring to FIG. 4E, a portion of the dielectric liner 210A on the surface 101 of the semiconductor substrate 10 may be patterned to form a dielectric liner 210A' having openings 120T exposing portions of the surface 101 of the semiconductor substrate 10. The patterning process may be performed by photolithography technology.

Figure 4F:
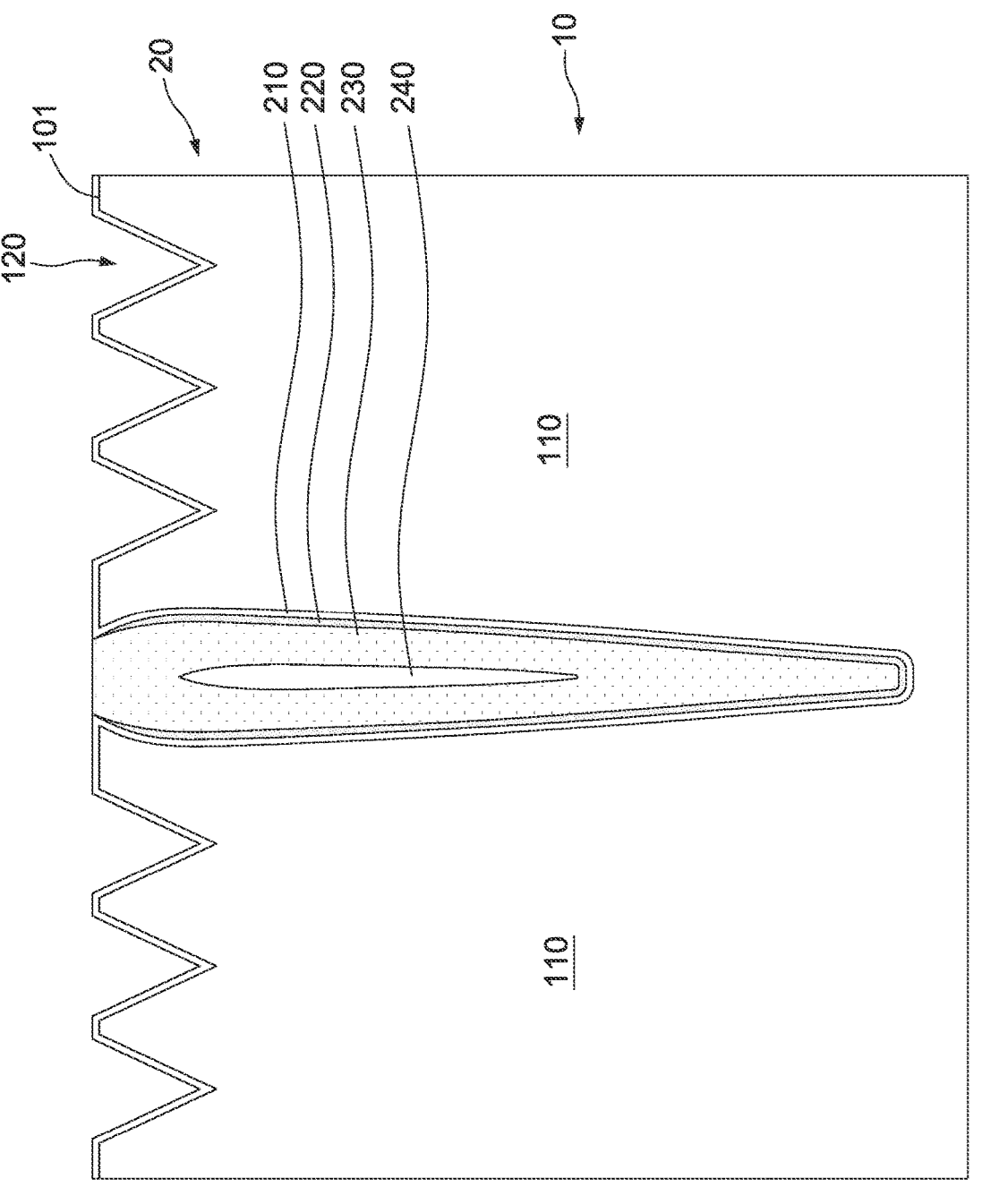

Referring to FIG. 4F, a plurality of grooves 120 may be formed extending from the surface 101 of the semiconductor substrate 10 toward the image sensing elements 110, and a dielectric material may be formed on surfaces of the grooves 120 together with the dielectric liner 210A' to form a dielectric liner 210. The dielectric material may be or include a high-k dielectric material. In some embodiments, the grooves 120 are free from overlapping the reflective element 220 from a top view perspective. As such, a deep trench reflective isolation structure 20 is formed in the semiconductor substrate 10.

In some embodiments, referring to FIGS. 1A-1B, prior to the steps illustrated in FIGS. 4A-4F, isolation structures 140 may be formed in the semiconductor substrate 10 to define various regions for the image sensing elements 110, transistor gate structures 130 may be formed on the surface 102 (or the front surface) of the semiconductor substrate 10, and an interconnection structure 40 may be formed over the surface 102 to electrically connect to the transistor gate structures 130.

In some embodiments, referring to FIGS. 1A-1B and 4A-4F, after the interconnection structure 40 is formed, the semiconductor substrate 110 may be flipped over, the steps illustrated in FIGS. 4A-4F may be performed to form the deep trench reflective isolation structure 20 in the semiconductor substrate 10, and a grid structure 30 may be formed over the reflective element 220 of the deep trench reflective isolation structure 20. In some embodiments, referring to FIGS. 1A-1B, a buffer layer 50 may be formed between the deep trench reflective isolation structure 20 and the grid structure 30. In some embodiments, referring to FIGS. 1A-1B, a dielectric layer 60 may be formed over the grid structure 30, a light filter structure 70 including light filters 70R, 70G, and 70B may be formed on the top surface of the dielectric layer 60, a dielectric layer 60A may be formed on the top surface of the dielectric layer 60, and lenses 80 may be respectively formed over the light filters 70R, 70G, and 70B. As such, the image sensor structure 1 illustrated in FIGS. 1A-1B is formed.

FIGS. 5A to 5F are cross-sectional views illustrating an image sensor structure 1 at various fabrication stages according to aspects of the present disclosure in one or more embodiments.

Figure 5A:
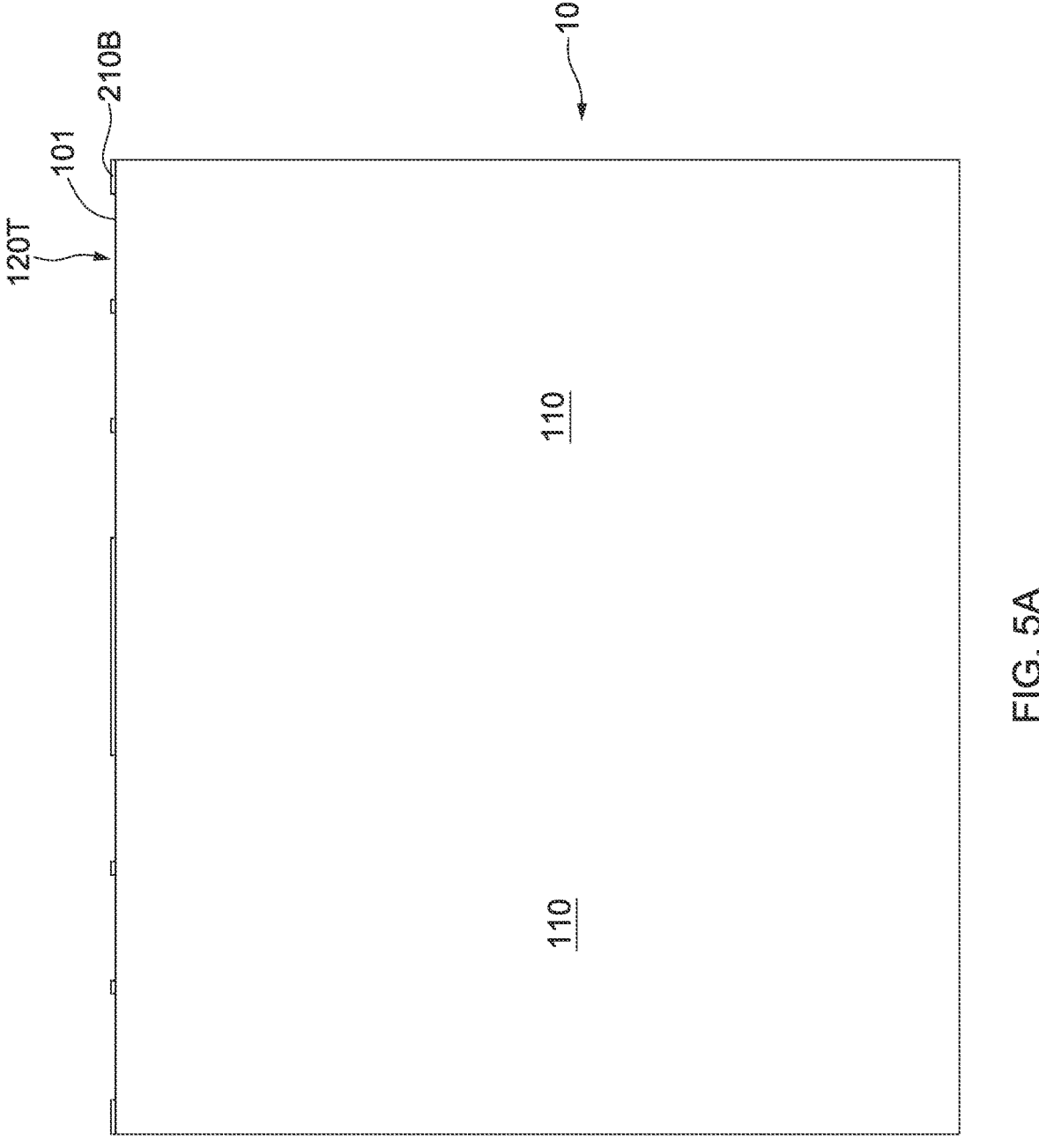
FIGS. 5A to 5F are cross-sectional views illustrating an image sensor structure at various fabrication stages according to aspects of the present disclosure in one or more embodiments.

Referring to FIG. 5A, a plurality of image sensing elements 110 may be formed in a semiconductor substrate 10, and a dielectric liner 210B may be formed on the surface 101 of the semiconductor substrate 10. In some embodiments, the dielectric liner 210B has openings 120T exposing portions of the surface 101 of the semiconductor substrate 10. The dielectric liner 210B may be or include a high-k dielectric material. In some embodiments, the dielectric liner 210B is formed by, for example, a CVD process, a thermal oxidation process, or other suitable process.

Figure 5B:
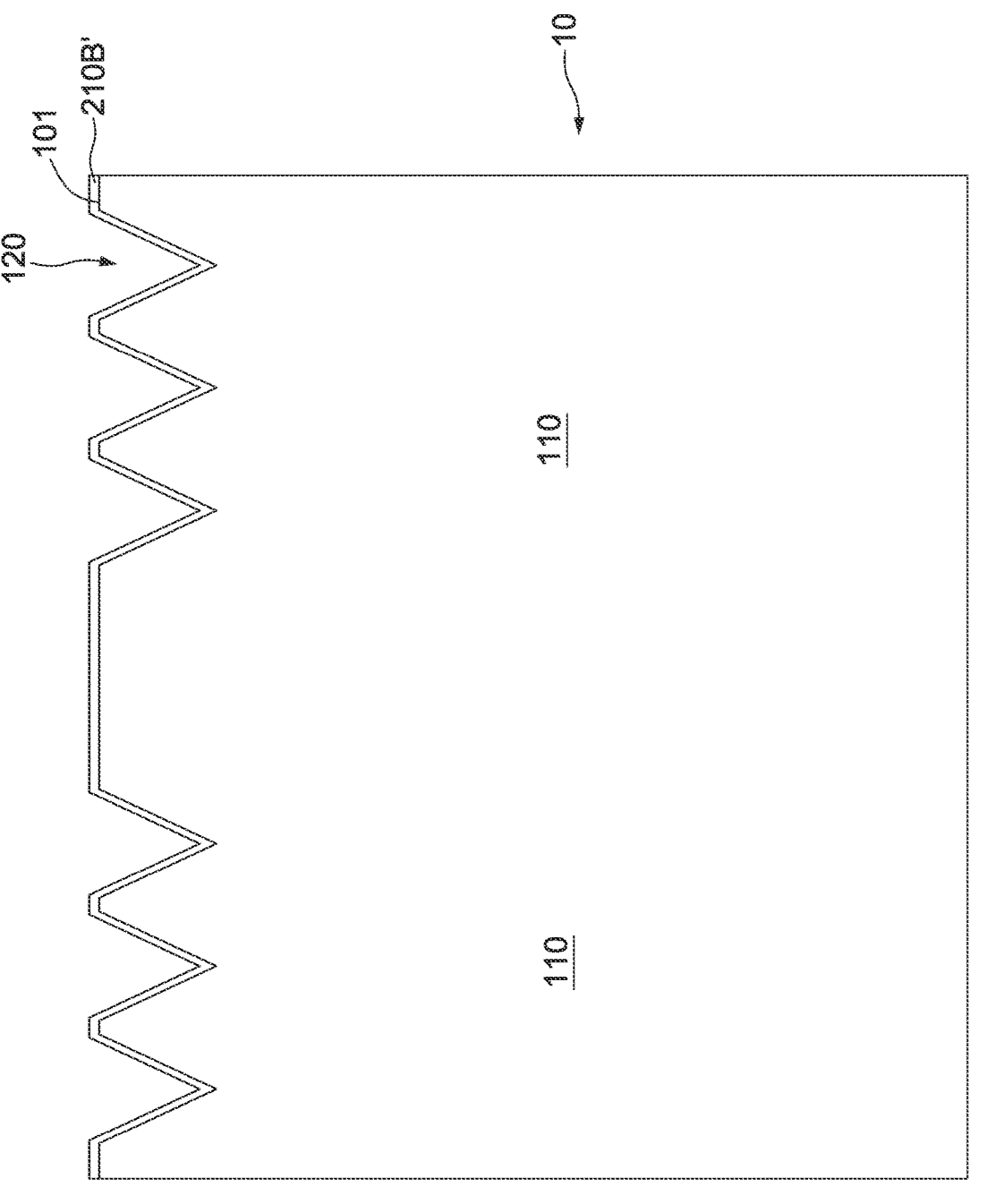

Referring to FIG. 5B, a plurality of grooves 120 may be formed extending from the surface 101 of the semiconductor substrate 10 toward the image sensing elements 110, and a dielectric material may be formed on surfaces of the grooves 120 together with the dielectric liner 210B to form a dielectric liner 210B'. The dielectric material may be or include a high-k dielectric material. In some embodiments, the grooves 120 are directly above the image sensing elements 110.

Figure 5C:
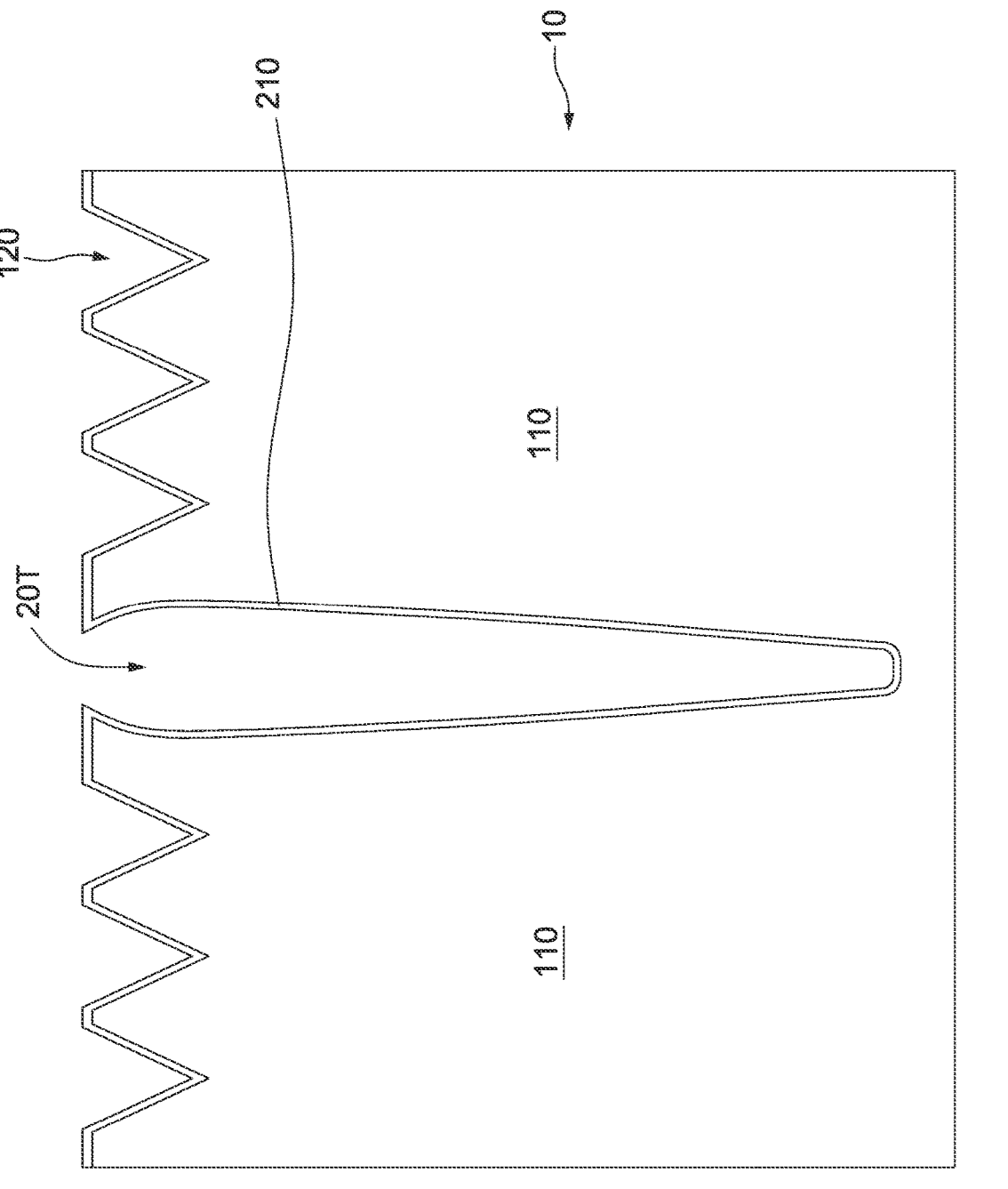

Referring to FIG. 5C, a deep trench 20T may be formed in the semiconductor substrate 10 and between the image sensing elements 110, and a dielectric material may be formed in the deep trench 20T together with the dielectric liner 210B' to form a dielectric liner 210. In some embodiments, the deep trench 20T may be formed by a dry etch process.

Figure 5D:
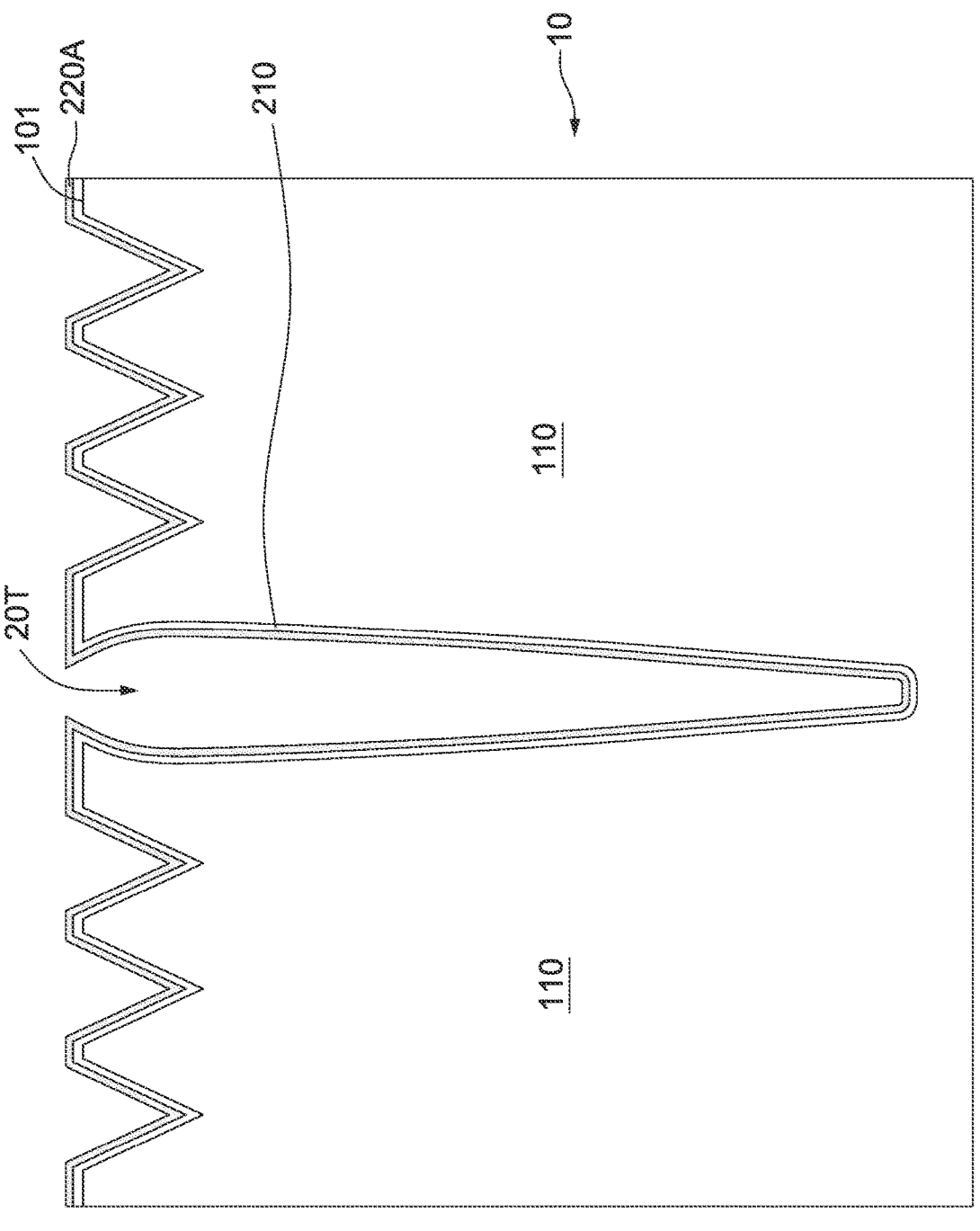

Referring to FIG. 5D, a reflective material 220A may be formed on the dielectric liner 210A and in the trench 20T and the grooves 120. In some embodiments, the reflective material 220A is formed by, for example, an ALD process, a CVD process, or other suitable deposition process.

Figure 5E:
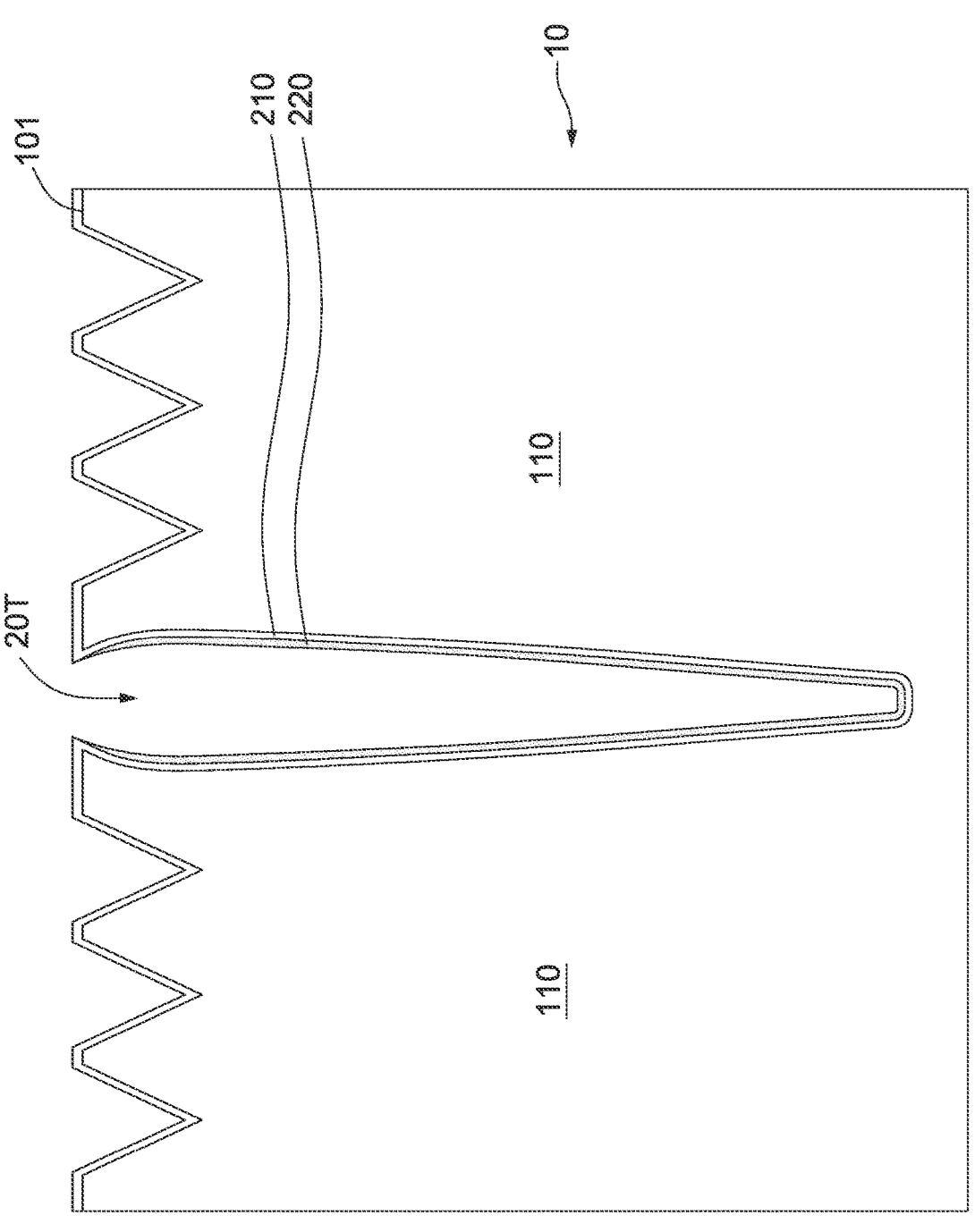

Referring to FIG. 5E, a portion of the reflective material 220A above the surface 101 of the semiconductor substrate 10 may be removed to form a reflective element 220. In some embodiments, the reflective material 220A is partially removed by a dry etch process with relatively low ion bombardment.

Figure 5F:
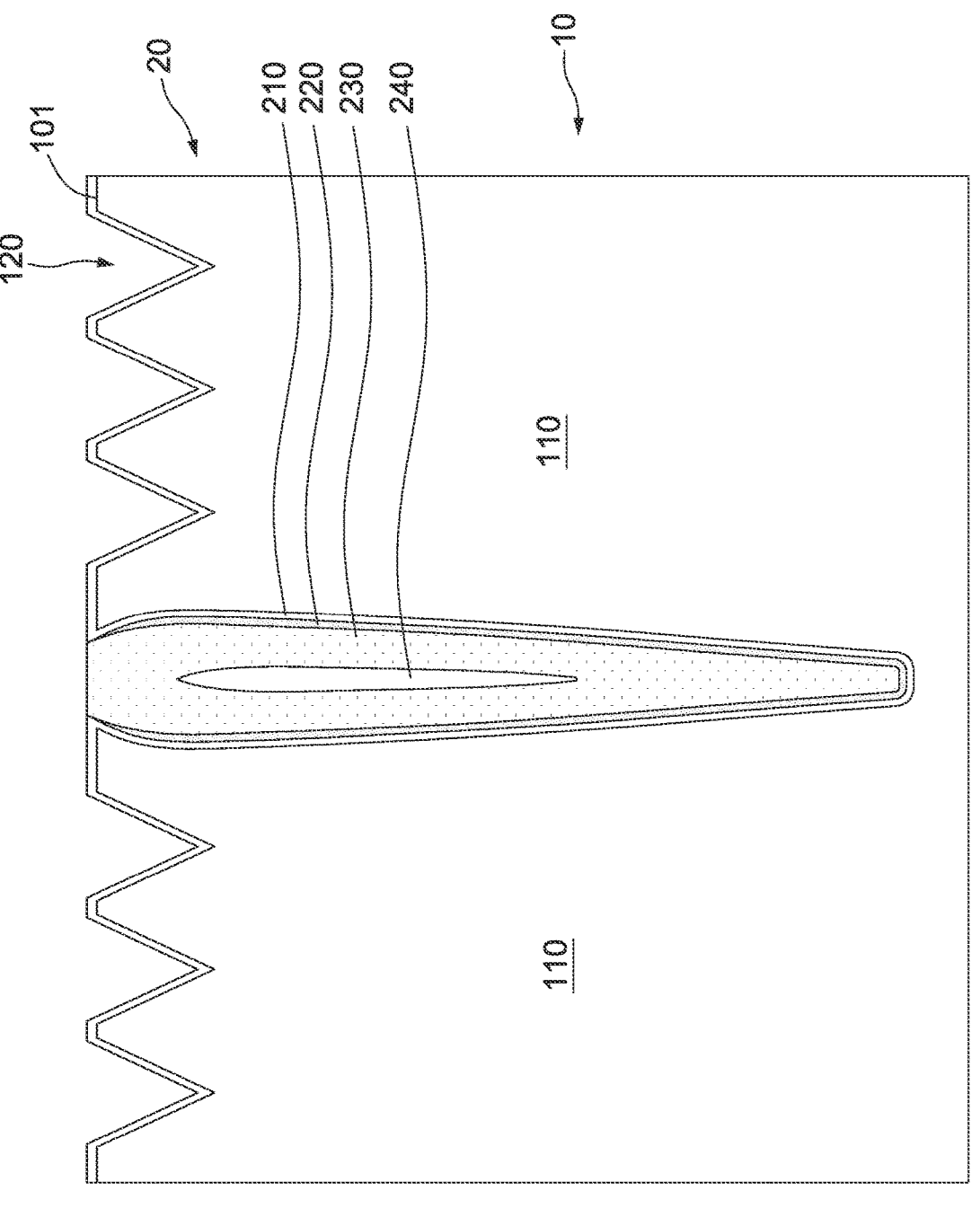

Referring to FIG. 5F, a filling dielectric 230 may be formed on the reflective element 220 and in the deep trench 20T. In some embodiments, a void 240 may be formed within the filling dielectric 230. In some embodiments, the filling dielectric 230 is formed by, for example, a CVD process or other suitable process. In some embodiments, a filling dielectric material may be formed on the reflective element 220 and over the surface 101 of the semiconductor substrate 10 followed by a CMP process to remove excess portions of the dielectric material over the surface 101 of the semiconductor substrate 10. As such, a deep trench reflective isolation structure 20 is formed in the semiconductor substrate 10.

In some embodiments, referring to FIGS. 1A-1B, prior to the steps illustrated in FIGS. 5A-5F, isolation structures 140 may be formed in the semiconductor substrate 10 to define various regions for the image sensing elements 110, transistor gate structures 130 may be formed on the surface 102 (or the front surface) of the semiconductor substrate 10, and an interconnection structure 40 may be formed over the surface 102 to electrically connect to the transistor gate structures 130.

In some embodiments, referring to FIGS. 1A-1B and 5A-5F, after the interconnection structure 40 is formed, the semiconductor substrate 110 may be flipped over, the steps illustrated in FIGS. 5A-5F may be performed to form the deep trench reflective isolation structure 20 in the semiconductor substrate 10, and a grid structure 30 may be formed over the reflective element 220 of the deep trench reflective isolation structure 20. In some embodiments, referring to FIGS. 1A-1B, a buffer layer 50 may be formed between the deep trench reflective isolation structure 20 and the grid structure 30. In some embodiments, referring to FIGS. 1A-1B, a dielectric layer 60 may be formed over the grid structure 30, a light filter structure 70 including light filters 70R, 70G, and 70B may be formed on the top surface of the dielectric layer 60, a dielectric layer 60A may be formed on the top surface of the dielectric layer 60, and lenses 80 may be respectively formed over the light filters 70R, 70G, and 70B. As such, the image sensor structure 1 illustrated in FIGS. 1A-1B is formed.

Some embodiments of the present disclosure provide an image sensor structure. The image sensor structure includes a semiconductor substrate, a plurality of image sensing elements, a reflective element, and a high-k dielectric structure. The image sensing elements are in the semiconductor substrate. The reflective element is in the semiconductor substrate and between the image sensing elements. The high-k dielectric structure is between the reflective element and the image sensing elements.

Some embodiments of the present disclosure provide an image sensor structure. The image sensor structure includes a semiconductor substrate, a plurality of image sensing elements, and a deep trench reflective isolation structure. The image sensing elements are in the semiconductor substrate. The deep trench reflective isolation structure is between the image sensing elements and configured to reflect an incident light received by the image sensor structure.

Some embodiments of the present disclosure provide a method for forming an image sensor structure. The method includes following operations: forming a plurality of image sensing elements in a semiconductor substrate; forming a deep trench in the semiconductor substrate and between the image sensing elements; forming a high-k dielectric structure in the deep trench; and forming a reflective element on the high-k dielectric structure in the deep trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor structure, comprising:
a semiconductor substrate;
a plurality of image sensing elements in the semiconductor substrate;

a reflective element in the semiconductor substrate and between the image sensing elements;
a high-k dielectric structure between the reflective element and the image sensing elements and over a back surface of the semiconductor substrate; and
a filling dielectric structure contacting and covered by the reflective element, wherein an air gap is within the filling dielectric structure, and the reflective element is free from being exposed to the air gap,
wherein in a cross-sectional view perspective, the reflective element comprises two portions on two opposite lateral surfaces of the filling dielectric structure and tapering toward the back surface of the semiconductor substrate.

2. The image sensor structure of claim 1, wherein the filling dielectric structure is between the image sensing elements and surrounded by the reflective element, the reflective element comprises a metal layer defining a space for accommodating the filling dielectric structure, the space has a top portion, a bottom portion, and a middle portion between the top portion and the bottom portion, and widths of the top portion and the bottom portion are less than a width of the middle portion.

3. The image sensor structure of claim 2, wherein a portion of the two opposite lateral surfaces of the filling dielectric structure is exposed by the reflective element and contacts the high-k dielectric structure.

4. The image sensor structure of claim 2, wherein the reflective element comprises a first portion directly under the air gap and a bottom surface of the filling dielectric structure and a second portion between the high-k dielectric structure and a lateral surface of the filling dielectric structure, wherein the first portion has a thickness greater than a thickness of the filling dielectric structure and a thickness of the second portion.

5. The image sensor structure of claim 1, wherein the semiconductor substrate further has a front surface opposite to the back surface, the reflective element extends from the back surface to the front surface, and the image sensor structure further comprises an isolation structure extending from the front surface of the semiconductor substrate and connected to the reflective element.

6. The image sensor structure of claim 1, wherein the reflective element is free from overlapping the image sensing elements from a top view perspective, and wherein in the cross-sectional view perspective, the two portions of the reflective element comprise two curved ends tapering toward the back surface and curved in different directions.

7. The image sensor structure of claim 6, further comprising a grid structure over light-receiving surfaces of the image sensing elements, wherein the two curved ends of the reflective element comprise metal and have a thickness decreasing toward the grid structure.

8. The image sensor structure of claim 1, wherein the reflective element comprises a metal layer directly contacting the high-k dielectric structure and defining a trench which the filling dielectric structure is filled in.

9. An image sensor structure, comprising:
a semiconductor substrate;
a plurality of image sensing elements in the semiconductor substrate; and
a deep trench reflective isolation structure between the image sensing elements and configured to reflect an incident light received by the image sensor structure;
an isolation structure in the semiconductor substrate and extending toward the deep trench reflective isolation structure; and a reflective high-k isolation liner covering a top surface and lateral surfaces of the isolation structure and connecting the isolation structure to the deep trench reflective isolation structure, wherein the reflective high-k isolation liner contacts the deep trench reflective isolation structure and the top surface and the lateral surfaces of the isolation structure.

10. The image sensor structure of claim 9, wherein the deep trench reflective isolation structure comprises:

a reflective layer having a reflection rate of 30% or higher; and a high-k dielectric liner between the reflective layer and the semiconductor substrate, wherein the high-k dielectric liner contacts the reflective layer and the reflective high-k isolation liner.

11. The image sensor structure of claim 10, wherein the deep trench reflective isolation structure comprises:

a filling dielectric at least partially covered by the reflective layer, wherein the filling dielectric comprises a top portion, a bottom portion, and a middle portion between the top portion and the bottom portion, and widths of the top portion and the bottom portion are less than a width of the middle portion, and wherein a void filled with air or an inner gas is within the filling dielectric and spaced apart from the reflective layer.

12. The image sensor structure of claim 10, wherein the semiconductor substrate has a plurality of grooves extending from a surface of the semiconductor substrate toward the image sensing elements, wherein the reflective layer has a thickness decreasing toward the surface of the semiconductor substrate.

13. The image sensor structure of claim 10, wherein the reflective layer is free from covering light-receiving surfaces of the image sensing elements.

14. The image sensor structure of claim 11, wherein the reflective layer comprises a metal layer surrounding the filling dielectric and having a top surface and a bottom surface opposite to the top surface, and a cross-sectional width of the metal layer decreases from a middle portion towards the top surface and the bottom surface.

15. The image sensor structure of claim 10, further comprising a grid structure over the deep trench reflective isolation structure, wherein a maximum width of the grid structure is less than a maximum width of the reflective layer from a top view perspective.

16. A method for forming an image sensor structure, comprising:

forming a plurality of image sensing elements in a semiconductor substrate;

forming a deep trench in the semiconductor substrate and between the image sensing elements;

forming a high-k dielectric structure conformally on inner walls of the deep trench;

forming a reflective element conformally on the high-k dielectric structure on the inner walls of the deep trench to form a trench defined by the reflective element in the deep trench; and filling the trench with a filling dielectric, wherein in a cross-sectional view perspective, the reflective element comprises two portions contacting two opposite lateral surfaces of the filling dielectric and tapering toward an opening of the trench.

17. The method of claim 16, wherein the deep trench has an opening having a width less than a width of a middle portion of the deep trench.

18. The method of claim 16, further comprising forming a plurality of grooves extending from a top surface of the semiconductor substrate toward the image sensing elements, wherein the grooves are free from overlapping the reflective element from a top view perspective.

19. The method of claim 16, further comprising forming a void within the filling dielectric when filling the trench with the filling dielectric.

20. The method of claim 16, further comprising forming a grid structure over the reflective element, wherein a width of the grid structure is less than a width of the reflective element.

* * * * *